US010544502B2

(12) United States Patent
Conolly et al.

(10) Patent No.: US 10,544,502 B2
(45) Date of Patent: Jan. 28, 2020

(54) FUNCTIONAL COMPOSITE GARMENT MATERIALS

(75) Inventors: Brian John Conolly, Northwood (AU); Thomas Kenneth Hussey, Balmain (AU); Christopher Hurren, Waurn Ponds (AU)

(73) Assignee: Xefco Pty Ltd, Lilyfield (AU)

( * ) Notice: Subject to any disclaimer, the term of this patent is extended or adjusted under 35 U.S.C. 154(b) by 896 days.

(21) Appl. No.: 13/481,190

(22) Filed: May 25, 2012

(65) Prior Publication Data

US 2012/0276332 A1 Nov. 1, 2012

Related U.S. Application Data

(63) Continuation of application No. PCT/AU2010/001603, filed on Nov. 30, 2010, and a
(Continued)

(30) Foreign Application Priority Data

Nov. 30, 2009 (AU) .................................. 2009905845
Aug. 27, 2010 (AU) .................................. 2010903853
(Continued)

(51) Int. Cl.
*B32B 15/14* (2006.01)
*C23C 14/56* (2006.01)

(52) U.S. Cl.
CPC ..... *C23C 14/562* (2013.01); *Y10T 428/24331* (2015.01); *Y10T 428/24851* (2015.01);
(Continued)

(58) Field of Classification Search
CPC ......... B32B 15/14; B32B 15/20; B32B 27/12; B32B 2307/306; B32B 2307/724
(Continued)

(56) References Cited

U.S. PATENT DOCUMENTS 3,379,803 A  4/1968 Tittmann et al.
4,136,222 A  1/1979 Jonnes
(Continued)

FOREIGN PATENT DOCUMENTS

EP  0367738 A2  5/1990
EP  0657279 A1  6/1995
(Continued)

OTHER PUBLICATIONS

Definition of "scrim" Complete Textile Dictionary, Celanese Acetate, 2001.*
(Continued)

*Primary Examiner* — Andrew T Piziali
(74) *Attorney, Agent, or Firm* — Nixon & Vanderhye P.C.

(57) ABSTRACT

Composite materials for use in garments or footwear, and a process for manufacture, and use thereof. Composite materials may have one or more functional properties including water repellency, antimicrobial function, insulation, moisture wicking, directional moisture transfer, body heat reflection, exterior heat reflection, body heat redistribution through conduction, as well as prevention of body heat loss through heat conduction.

9 Claims, 21 Drawing Sheets

Related U.S. Application Data continuation of application No. PCT/IB2011/002872, filed on Nov. 29, 2011.

(60) Provisional application No. 61/503,873, filed on Jul. 1, 2011, provisional application No. 61/503,920, filed on Jul. 1, 2011, provisional application No. 61/509,447, filed on Jul. 19, 2011, provisional application No. 61/509,435, filed on Jul. 19, 2011.

(30) Foreign Application Priority Data

| | | |
|---|---|---|
| Feb. 15, 2011 | (AU) | 2011900481 |
| Feb. 15, 2011 | (AU) | 2011900484 |
| Feb. 15, 2011 | (AU) | 2011900485 |
| Feb. 17, 2011 | (AU) | 2011900527 |
| May 16, 2011 | (AU) | 2011901818 |

(52) U.S. Cl.
CPC ........... *Y10T 428/249921* (2015.04); *Y10T 428/3154* (2015.04); *Y10T 428/31678* (2015.04); *Y10T 442/30* (2015.04); *Y10T 442/60* (2015.04)

(58) Field of Classification Search
USPC ......... 442/76, 77, 86, 286; 428/98, 131, 137
See application file for complete search history.

(56) References Cited

U.S. PATENT DOCUMENTS

| | | |
|---|---|---|
| 4,443,511 A | 4/1984 | Worden et al. |
| 4,467,005 A | 8/1984 | Pusch et al. |
| 4,569,874 A | 2/1986 | Kuznetz |
| 4,583,247 A | 4/1986 | Fingerhut et al. |
| 4,739,012 A | 4/1988 | Hagman |
| 4,842,893 A | 6/1989 | Yializis et al. |
| 4,868,062 A | 9/1989 | Hoeschele et al. |
| 4,954,371 A | 9/1990 | Yializis |
| 4,974,382 A | 12/1990 | Avellanet |
| 4,999,222 A | 3/1991 | Jones et al. |
| 5,032,461 A | 7/1991 | Shaw et al. |
| 5,359,735 A | 11/1994 | Stockwell |
| 5,547,508 A | 8/1996 | Affinito |
| 5,599,585 A | 2/1997 | Cohen |
| 5,750,242 A | 5/1998 | Culler |
| 5,955,175 A | 9/1999 | Culler |
| 6,066,826 A | 5/2000 | Yializis |
| 6,083,628 A | 7/2000 | Yializis |
| 6,183,855 B1 | 2/2001 | Buckley |
| 6,231,939 B1 | 5/2001 | Shaw et al. |
| 6,270,841 B1 | 8/2001 | Mikhael et al. |
| 6,723,378 B2 | 4/2004 | Hrubesh et al. |
| 6,800,573 B2 | 10/2004 | Van De Ven et al. |
| 7,118,801 B2 | 10/2006 | Ristic-Lehmann et al. |
| 7,157,117 B2 | 1/2007 | Mikhael et al. |
| 2004/0213918 A1 | 10/2004 | Mikhael et al. |
| 2005/0271821 A1 | 12/2005 | Lee et al. |
| 2006/0099431 A1 | 5/2006 | Scholz |
| 2007/0037465 A1 | 2/2007 | Nutz et al. |
| 2007/0166528 A1 | 7/2007 | Barnes et al. |
| 2008/0060302 A1* | 3/2008 | Bletsos et al. .................. 52/408 |
| 2008/0063870 A1 | 3/2008 | O'Rear et al. |
| 2008/0105373 A1 | 5/2008 | Ristic-Lehmann et al. |
| 2010/0003877 A1 | 1/2010 | Fan et al. |
| 2010/0247855 A1* | 9/2010 | Bletsos et al. ................ 428/137 |

FOREIGN PATENT DOCUMENTS

| | | |
|---|---|---|
| WO | 9818852 A1 | 5/1998 |
| WO | 9958757 A1 | 11/1999 |
| WO | 9959185 A1 | 11/1999 |
| WO | 0128770 A1 | 4/2001 |
| WO | 2010018660 A1 | 2/2010 |
| WO | 2011063472 A1 | 6/2011 |

OTHER PUBLICATIONS

International Search Report and Written Opinion of the International Searching Authority; Application No. PCT/IB2011/002872; dated Apr. 11, 2012; dated Apr. 20, 2012; 18 pages.

International Search Report; Application No. PCT/AU2010/001603; dated Feb. 21, 2011; dated Mar. 8, 2011; 5 pages.

* cited by examiner

FIG. 5a
FIG. 5b
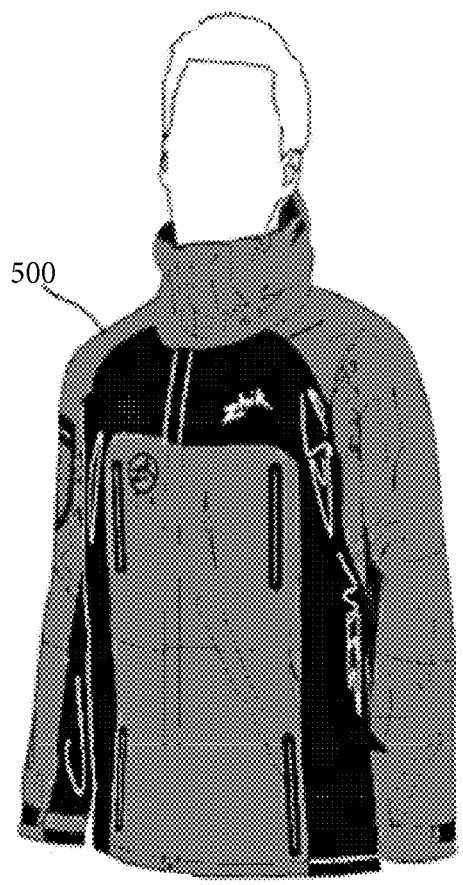
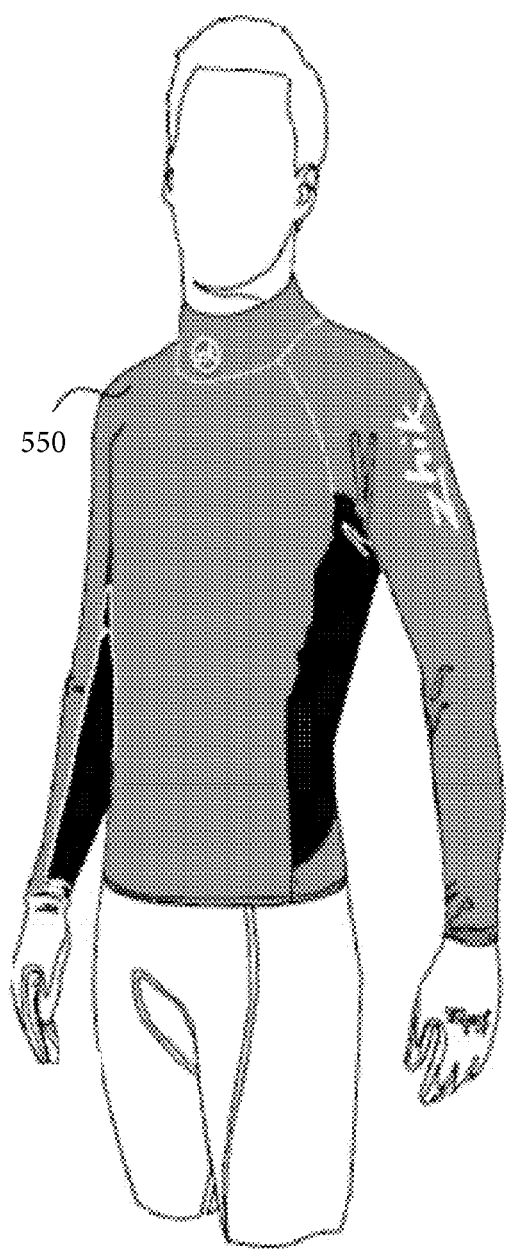

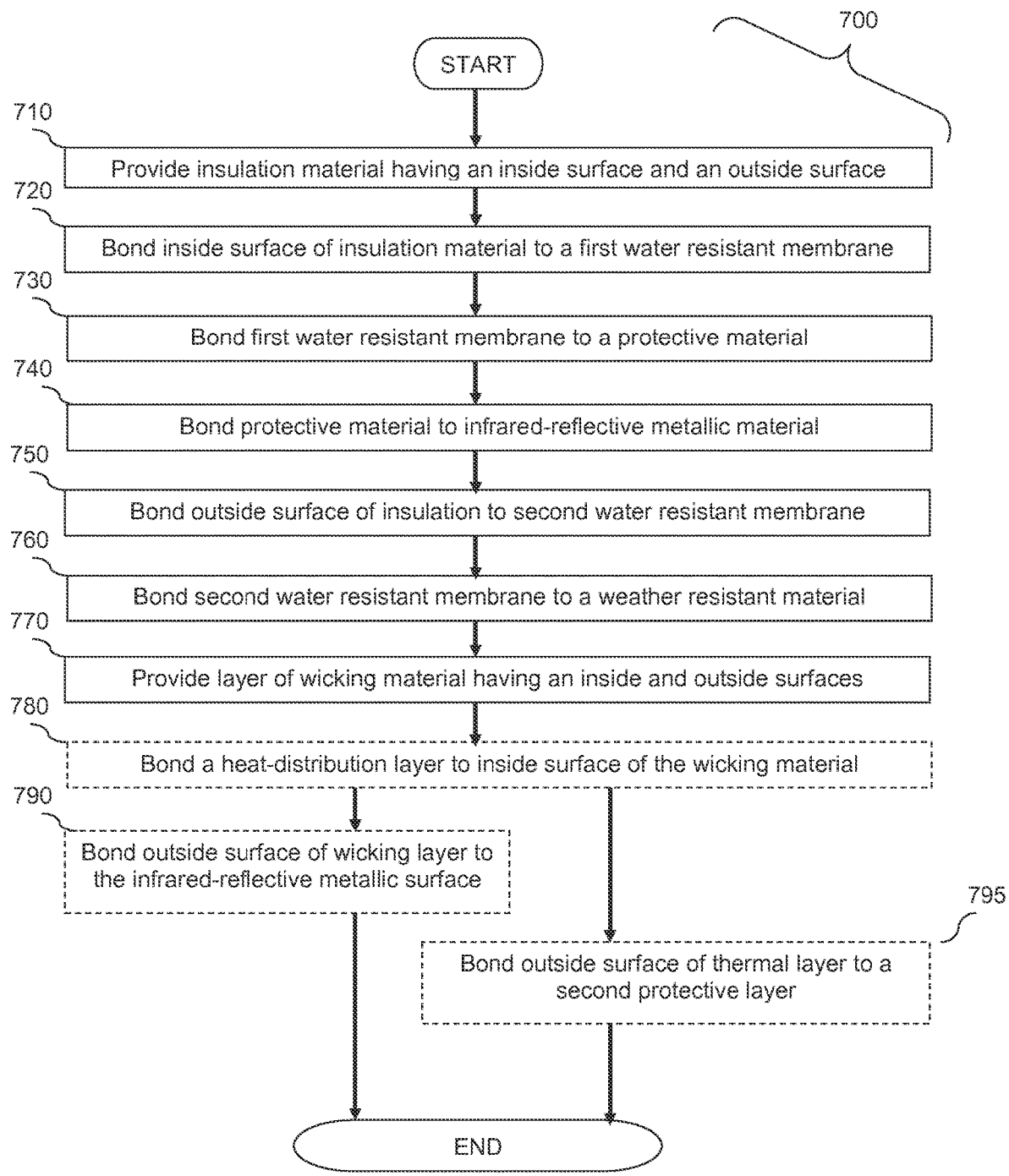

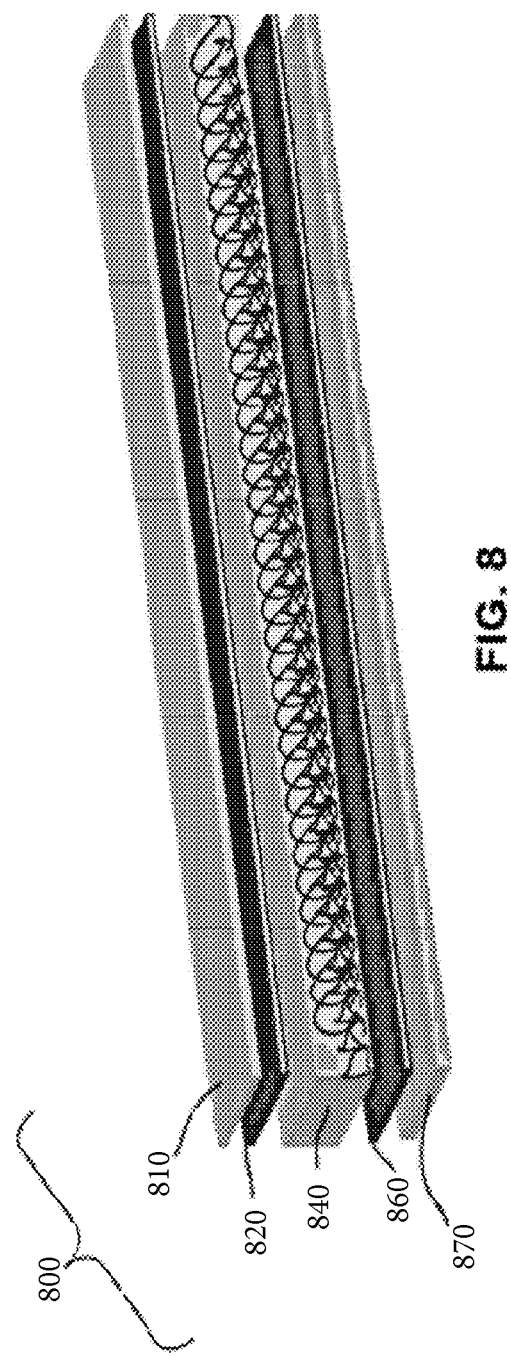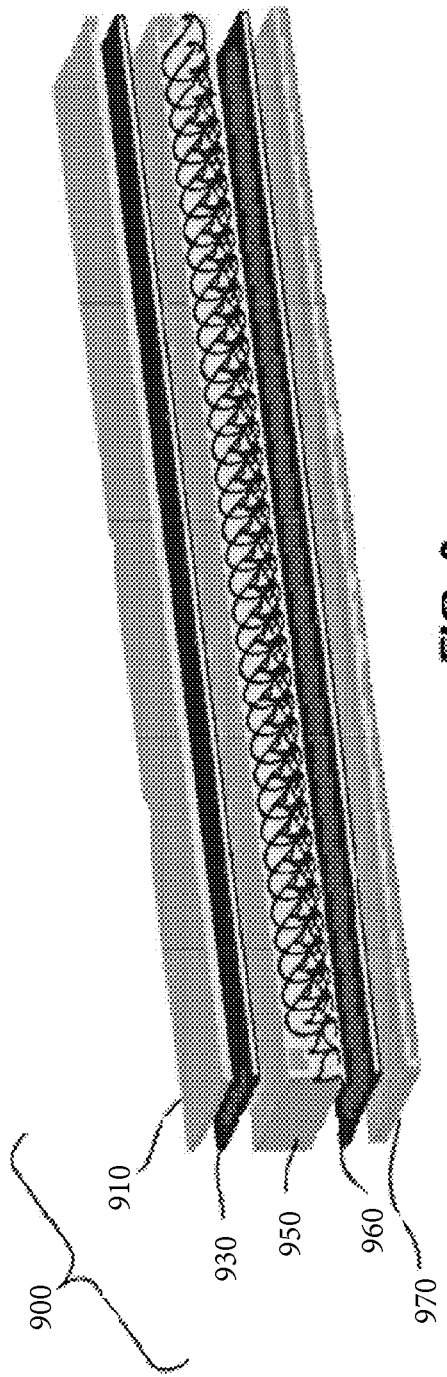

FIG. 10a
FIG. 10b
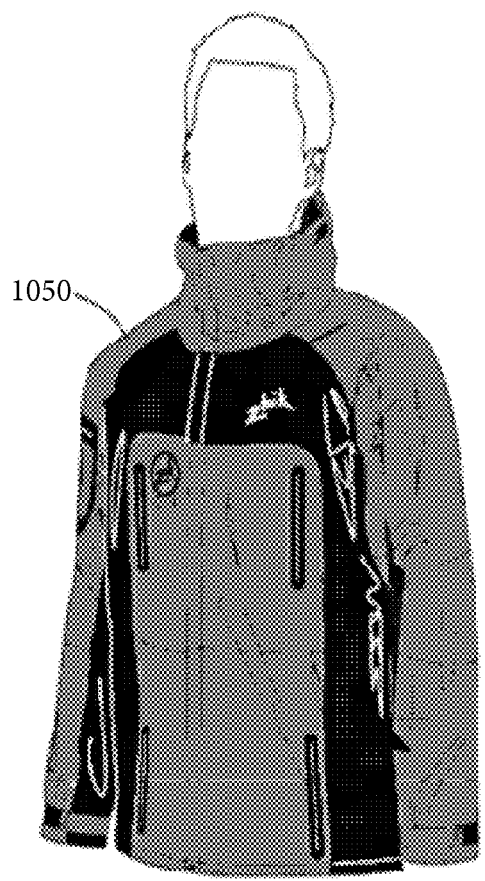
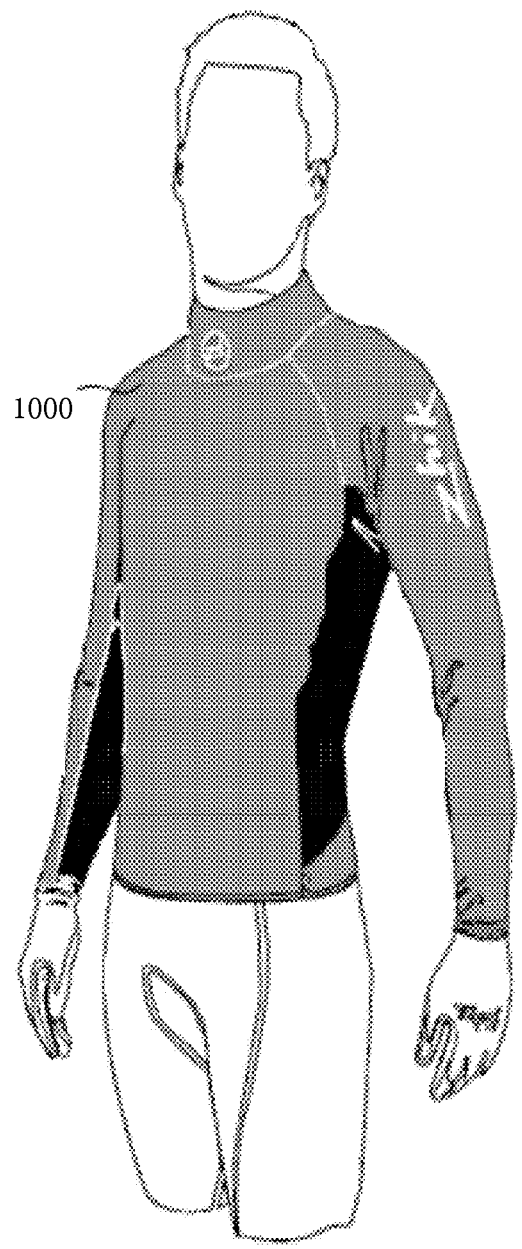

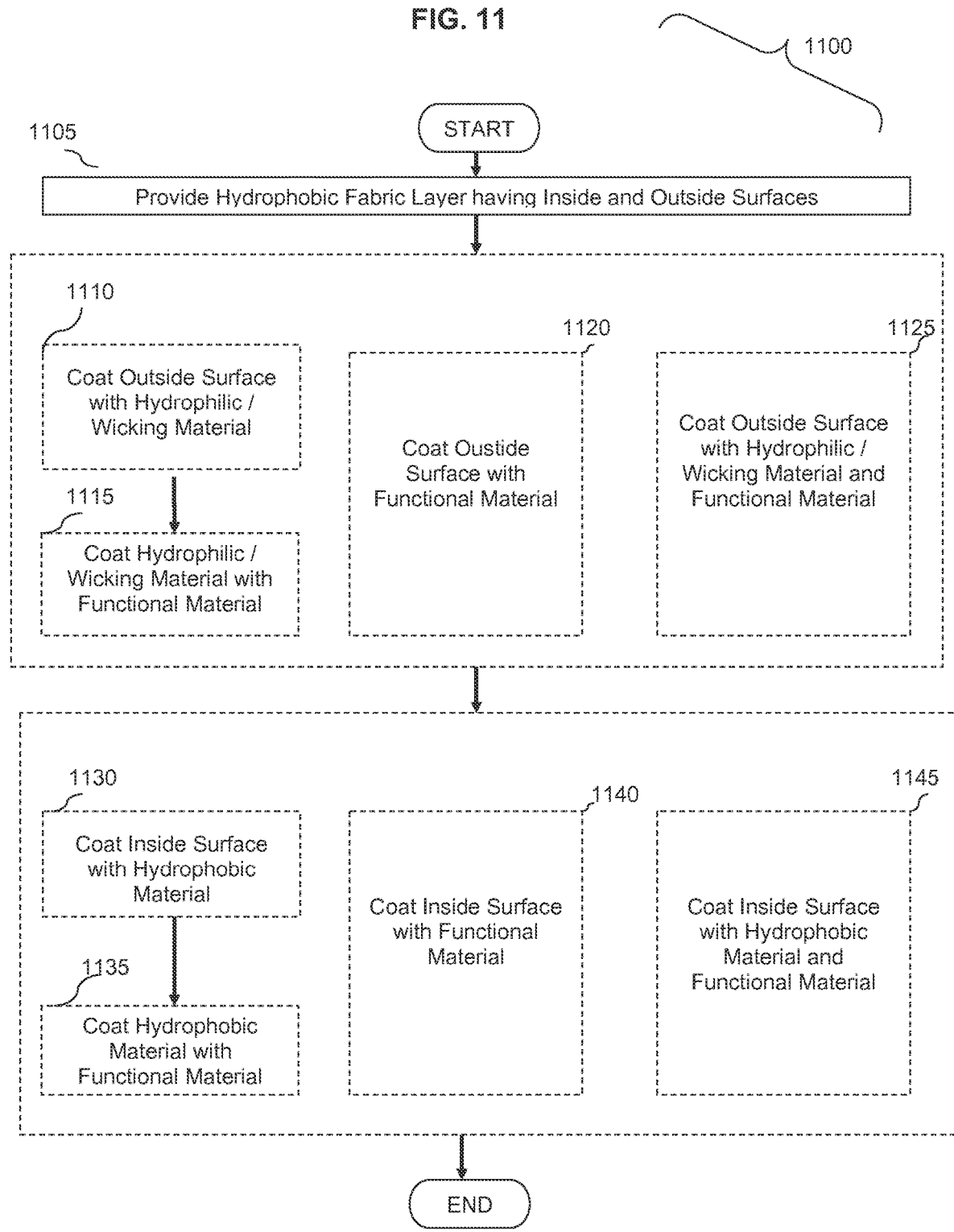

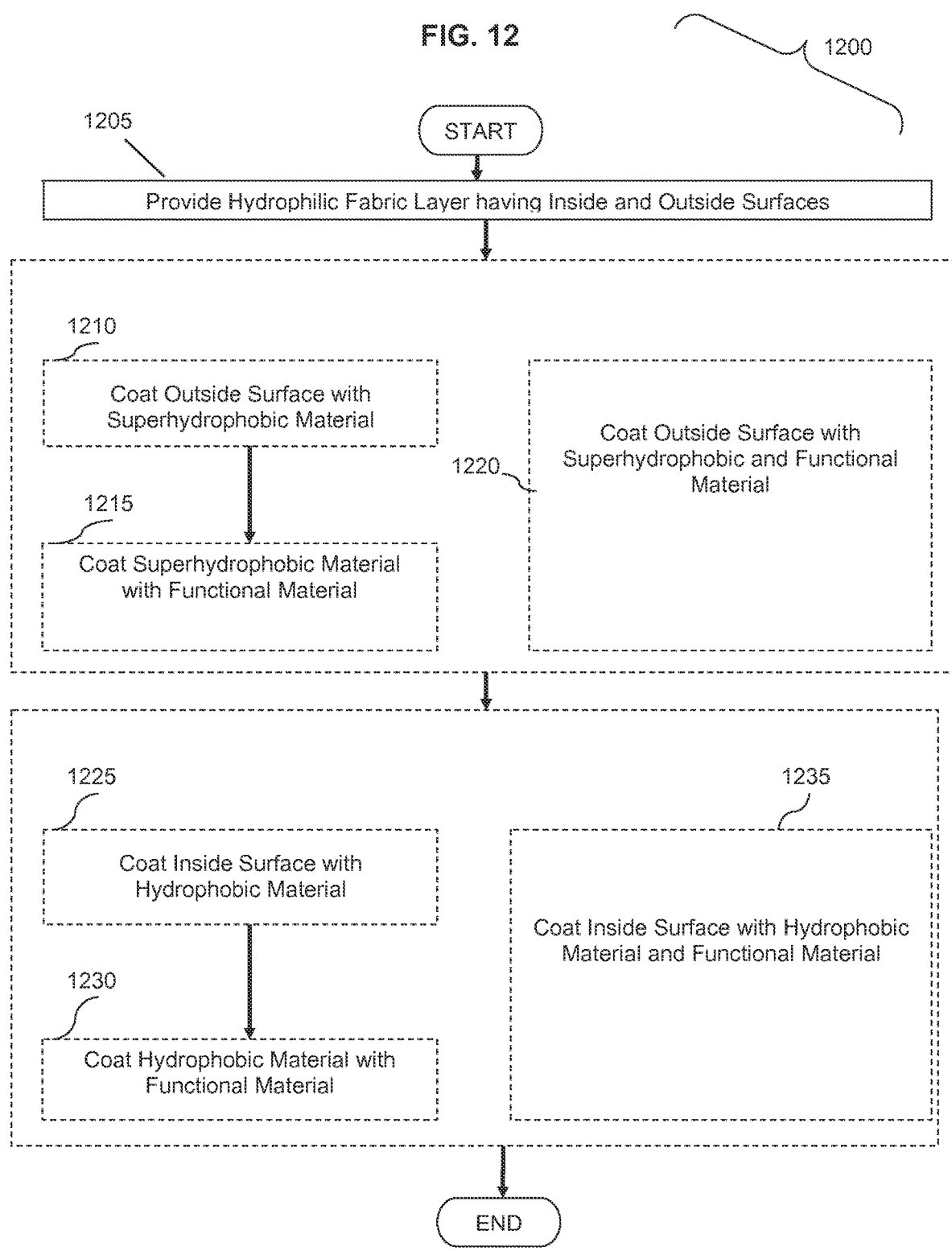

FIG. 14a        FIG. 14b
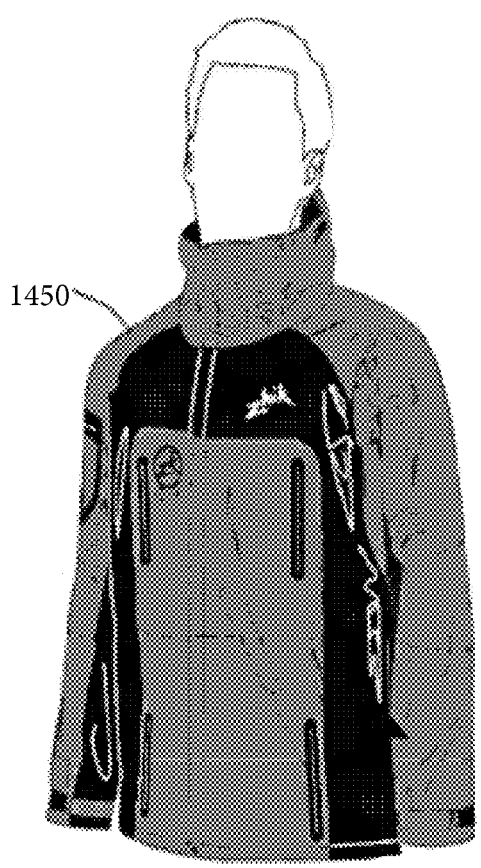
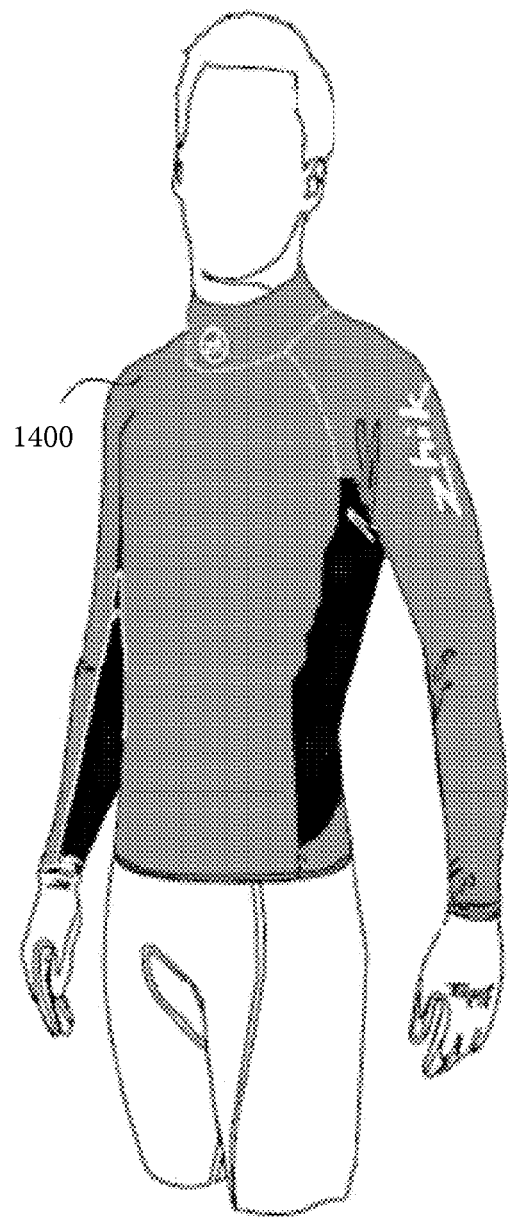

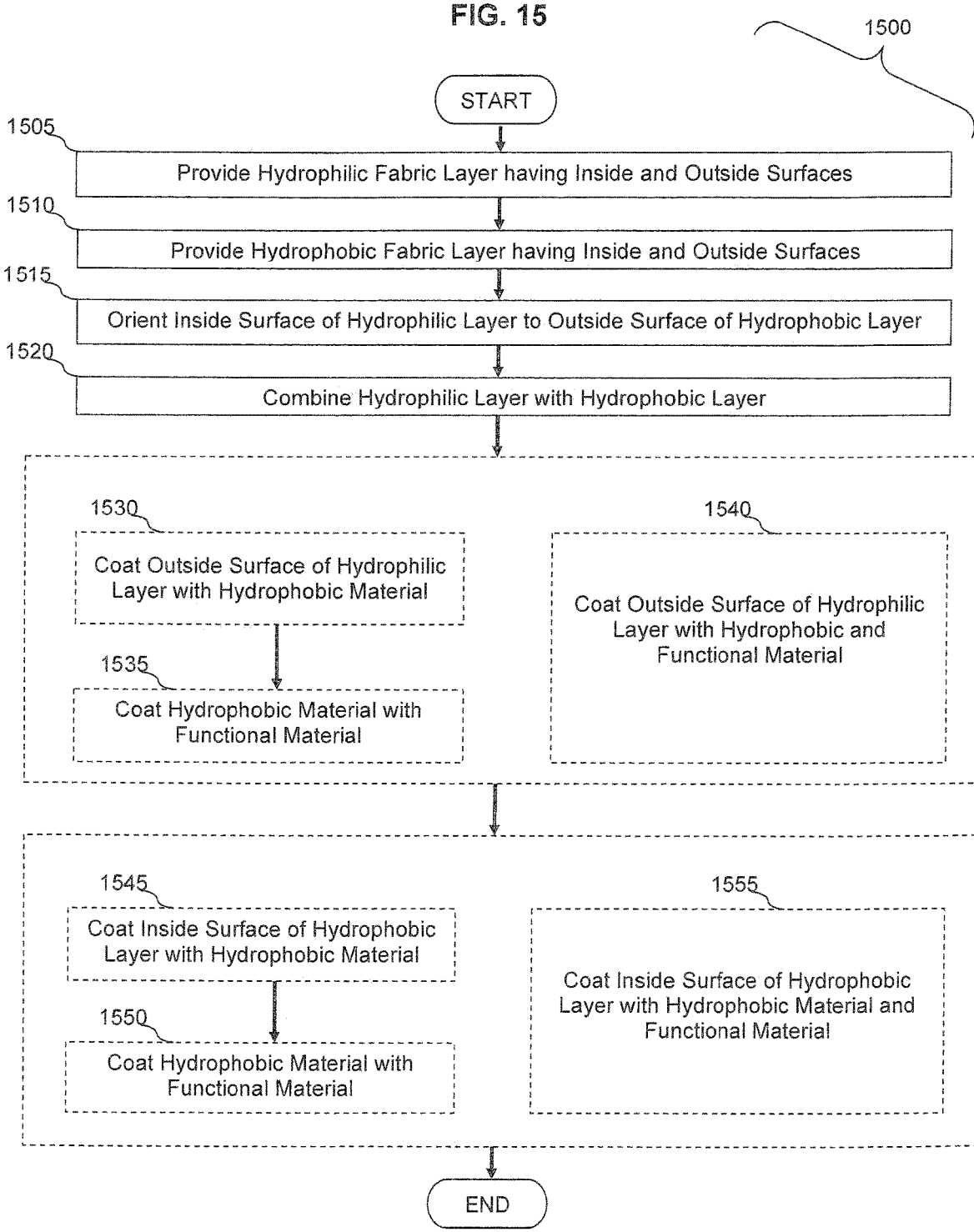

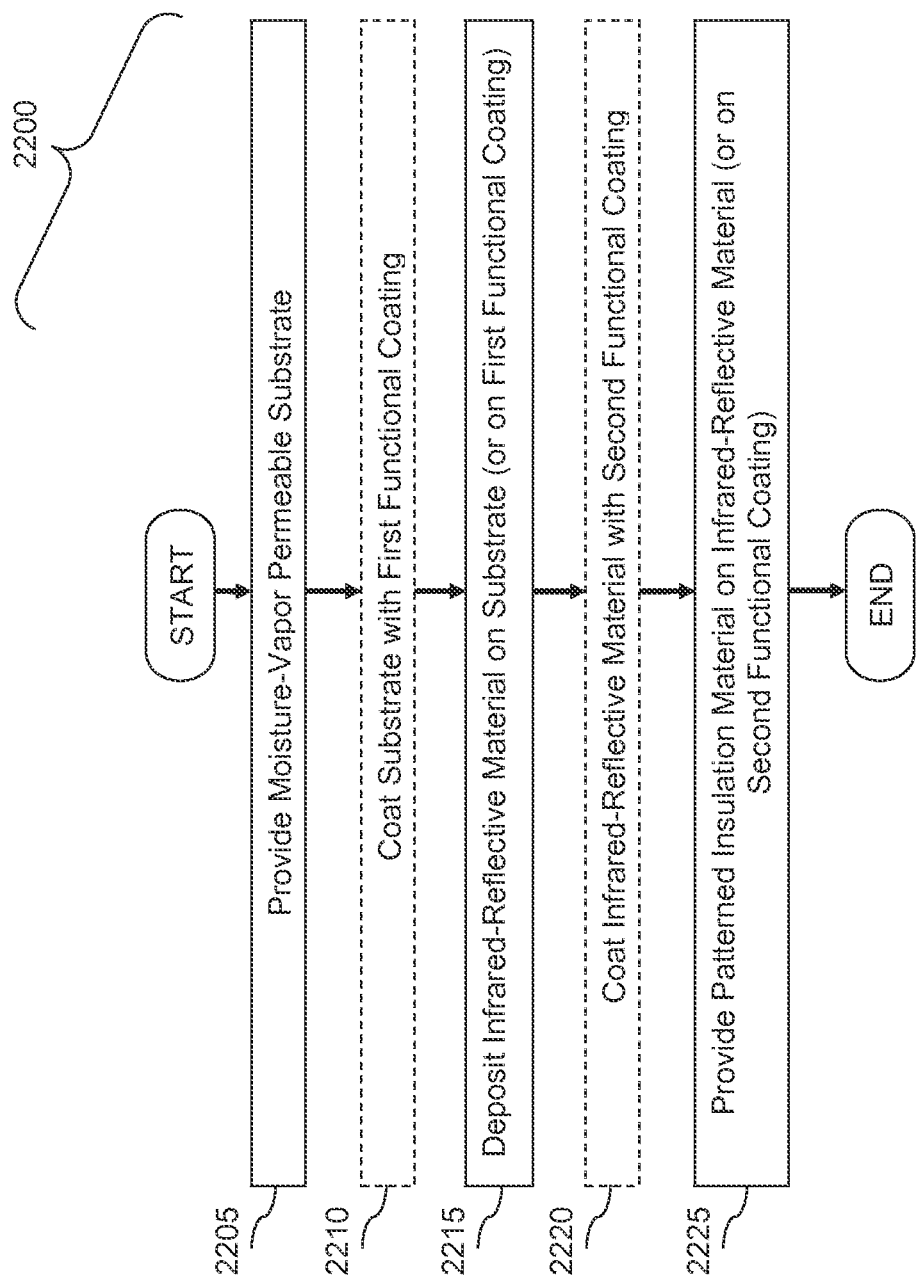

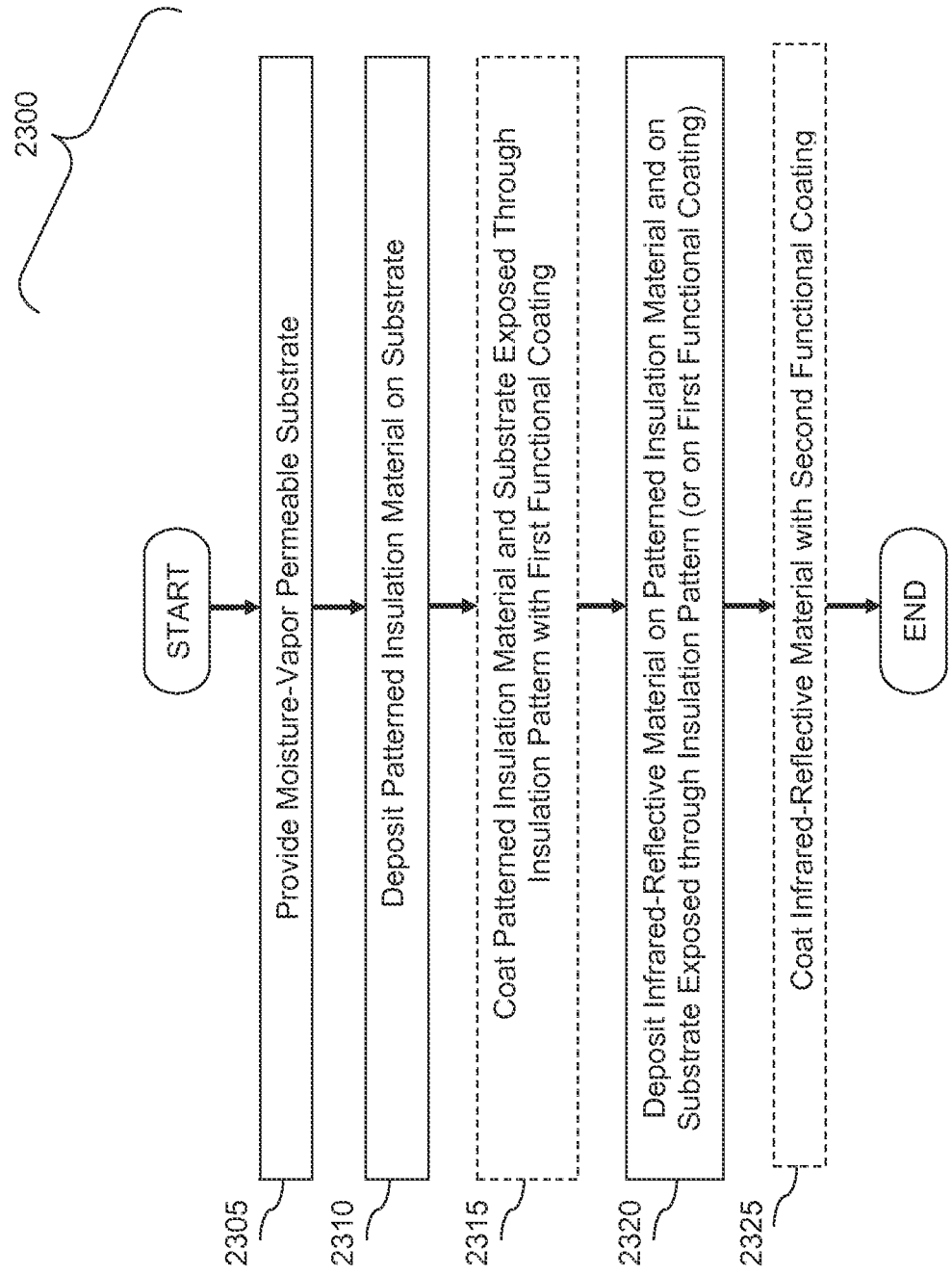

FUNCTIONAL COMPOSITE GARMENT MATERIALS

CROSS-REFERENCE TO RELATED APPLICATIONS

The present application is a continuation of pending International Patent Application PCT/AU2010/001603 filed on Nov. 30, 2010, which designates the United States and claims priority from the following applications: AU 2010903853 filed Aug. 27, 2010 and AU 2009905845 filed Nov. 30, 2009. The content of all prior applications is incorporated herein by reference.

The present application is also a continuation of pending International Patent Application PCT/IB2011/002872 filed on Nov. 29, 2011, which designates the United States and claims priority from the following applications: AU 2011900481 filed Feb. 15, 2011, AU 2011900484 filed Feb. 15, 2011, AU 2011900485 filed Feb. 15, 2011, AU 2011900527 filed Feb. 17, 2011, AU 2011901818 filed May 16, 2011, U.S. 61/509,873 filed Jul. 1, 2011, U.S. 61/503,920 filed Jul. 1, 2011, U.S. 61/509,447 filed Jul. 19, 2011, and U.S. 61/509,435 filed Jul. 19, 2011. The content of all prior applications is incorporated herein by reference.

FIELD OF THE INVENTION

The present invention relates to composite materials for use in garments or footwear, a process for manufacture, and use thereof. In particular, the present invention relates to composite materials having one or more functional properties including water repellency, antimicrobial function, insulation, moisture wicking, directional moisture transfer, body heat reflection, exterior heat reflection, body heat redistribution through conduction, as well as prevention of body heat loss through heat conduction.

BACKGROUND OF THE INVENTION

The term "functionalization" and related terminology are used in the art and herein to refer to the process of treating a material to alter its surface properties to meet specific requirements for a particular application. For example, the surface energy of a material may be treated to render it particularly hydrophobic or hydrophilic as may be desirable for a given use. Thus, surface functionalization has become common practice in the manufacture of many materials because it adds value to the end product. In order to achieve such different ultimate results, functionalization may be carried out in a variety of ways ranging from wet chemistry to various forms of vapor deposition, vacuum metallization and sputtering.

Some examples of functional materials include hydrophilic materials, including monomers containing one or more of hydroxyl, carboxyl, sulphonic, amino, or amido functional groups; hydrophobic materials, including monomers or sol-gels containing a fluorinated functional group, or monomers or sol-gels comprising a hydrophobic nanostructure; antimicrobial materials, including monomers or sol-gels comprising an antimicrobial functional group, an encapsulated antimicrobial agent, a chlorinated aromatic compound, or a naturally occurring antimicrobial agent; fire-retardant materials, including monomers or sol-gels comprising a brominated functional group; self-cleaning materials, including photo-catalytically active chemicals, a metal oxide; zinc oxide, titanium dioxide, or tungsten dioxide; ultraviolet protective materials, including titanium dioxide; and, acrylic polymers.

The term "superhydrophobic" is known in the art, and includes a material property whereby the contact angle of a water droplet is extremely high, for example, exceeding 150°.

The term "superhydrophilic" is known in the art, and includes a material property whereby the contact angle of a water droplet is extremely low, for example, approximately 0°.

The term "wicking" is known in the art, and includes a material property whereby moisture is transported into a fabric or other material by capillary or other action.

Various types of composite materials are known in the prior art.

Unfortunately, these materials have a number of deficiencies making them less suitable for incorporation into apparel, particularly in their thermal properties, moisture management, water repellency, and durability.

For Example, U.S. Pat. No. 5,955,175 to Culler describes a textile material produced by metalizing a microporous membrane. The metallization causes a reflection of thermal radiation. The metal forms a discontinuous layer on the surface and on the pore walls of the microporous membrane that are adjacent to the surface. Compared to the size of water molecules, the pores of the microporous membrane are very large, even in the metalized state, so that the water-vapor permeability of the microporous membrane is maintained even after it is metalized.

These fabrics are both air permeable and moisture vapor permeable after being metalized and coated with an oleophobic coating. However, the microporous membranes are considerably less durable than monolithic non porous counterparts, particularly in outdoor apparel applications and in salty environments.

Water-vapor-permeable, watertight, and heat-reflecting composites made from a metal layer and a nonporous substrate, have been disclosed in U.S. Pat. No. 6,800,573 to Van de Ven, et al., where metalization takes place using vacuum plasma cleaning and vapor deposition onto the nonporous substrate which is a membrane adhered to spaced apart textile filaments.

However, no coating is applied between the substrate and the metal layer thereby leaving the metal layer vulnerable to oxidization. In Van de Ven et al, the water-vapor-permeable membrane itself is metalized, which creates manufacturing and durability problems, and compromises the moisture permeability of the membrane compared to its original non-metalized state.

In the present invention a textile with appropriate moisture management is metalized prior to lamination to the membrane, which has the added benefit of improving the moisture wicking, permeability, and breathability of the composite laminate material, as well as improving the durability and insulation of the metallization from conductive heat loss. The metallization can also be sandwiched between the water-vapor-permeable membrane and supporting fabric which helps to insulate the conductive nature of the metallization from heat transfer via convection. The present invention also possesses advantages in manufacturing and logistics whereby a single metalized textile may be used in a range of different composites materials.

U.S. Pat. No. 4,999,222 to Jones et al. describes moisture vapor permeable metalized polyethylene sheets with low emissivity prepared by calendaring a plexifilamentary film-fibril sheet followed by vacuum metallization. U.S. Pat. No.

4,974,382 to Avellanet describes an infiltration and energy barrier that can be vapor permeable or impermeable having at least one metalized layer thereon. Published PCT International Application No. WO 01/28770 to Squires et al. describes breathable building membranes that include an under layer of microporous film and a top layer formed of a filamentous polymeric fabric, for example a spun bond fabric, which is provided with a moisture vapor permeable reflective metal coating.

While the breathable metalized substrates described above provide a thermal barrier by reflecting infrared radiation, they are susceptible to oxidation of the metal layer upon exposure to air and moisture. An oxidized metal layer generally has a higher emissivity than the corresponding metal and is less effective as a thermal barrier. In addition, the thin exposed metal layer can be damaged during processing and installation.

When the use of metallization to create infrared reflecting barriers is adopted for clothing or outdoor equipment such as sleeping bags or tents, corrosion, particularly in salty environments, of these metal layers through oxidization can be considerable and accelerated.

US Patent Application Publication US 2004/0213918 A1 (Mikhael et al.) discloses a process for functionalizing a porous substrate, such as a nonwoven fabric or paper, with a layer of polymer, and optionally a layer of metal or ceramic. According to one embodiment, the process includes the steps of flash evaporating a monomer having a desired functionality in a vacuum chamber to produce a vapor, condensing the vapor on the porous substrate to produce a film of the monomer on the porous substrate, curing the film to produce a functionalized polymeric layer on the porous substrate, vacuum depositing an inorganic layer over the polymer layer, and flash evaporating and condensing a second film of monomer on the inorganic layer and curing the second film to produce a second polymeric layer on the inorganic layer. Mikhael et al. also discloses another embodiment including the steps of flash evaporating and condensing a first film of monomer on the porous substrate to produce a first film of the monomer on the porous substrate, curing the film to produce a functionalized polymeric layer on the porous substrate, vacuum depositing a metal layer over the polymer layer, and flash evaporating and condensing a second film of monomer on the metal layer and curing the second film to produce a second polymeric layer on the metal layer. US Patent Applications US 2007/0166528 A1 (Barnes et al.) discloses a process for oxidizing the surface of a metal coating with an oxygen-containing plasma to form a synthetic metal oxide coating, to create resistance to corrosion of the metallized porous sheet.

However, these sheets, are micro-porous and less durable than other non-porous monolithic membranes known in the art.

It is therefore desired to provide composite garment materials which address these deficiencies.

SUMMARY OF THE INVENTION

Accordingly, it is an object of the present invention to provide the following composite structures.

Water Resistant Breathable Stretchable Composites

It is an object of the present invention to provide stretchable composite material comprising:

a layer of insulation material having an inside surface and an outside surface, a first water resistant membrane covering the inside surface of the layer of insulation material; and a layer of infrared-reflective metallic material covering the water resistant membrane.

Optionally, the water resistant membrane is bonded to a protective material, and the protective material may be disposed between the water resistant membrane and the infrared reflective material.

In accordance with aspects of the present invention, there is provided a water resistant, nonwoven composite for apparel or footwear including: a layer of high thermal insulation provided using a 3D spacer fabric, perforated foam or aerogel; protected by water resistant membranes. Preferably the composite includes a high stretch and breathable nature.

The composite may also include a metallic aluminum or silver fiber heat reflection layer combined with a thermal heat retention layer of synthetic hollow fleece. At least one of the layers preferably can include an antimicrobial treatment. Preferably the composite also includes an inner heat conduction layer with high wicking moisture management and heat equalizing properties, the inner heat conduction layer made of a natural or polyester fiber with heat conducting property or with the addition of some heat conducting thread.

In accordance with further aspects of the present invention, there is provided apparel for clothing an individual, comprising, on at least a portion of the apparel, a combination of layers constructed in accordance with the preceding paragraphs.

In accordance with further aspects of the present invention, there is provided apparel for clothing an individual comprising of a high stretch inner garment combined with a low stretch outer shell, where the two garments together provide a thermal system where the outer layer acts as a water repellent insulating shell made in a fabric composite and the inner high stretch garment is a hollow core fleece with a heat reflection layer.

The composite may also include an inner heat conduction layer with high wicking moisture management and heat equalizing properties, made of a natural or polyester fiber with heat conducting property or with the addition of a heat conducting thread.

Directional Water Transmission Composites

It is an object of the present invention to provide a thin layer fabric that has high wicking on its outer surface which forms a directional water transport system to assist the movement of moisture from the inner (skin side) surface to the outer surface, It is also provided that the fabric resists water entry from the outside surface to the inside surface of the fabric. The fabric is of a highly breathable nature and moisture transport control does not interfere with the breathability of the fabric In accordance with aspects of the present invention, the fabric selected should provide maximum surface area on its outer surface in order to enhance evaporation from its surface. This is achieved by selecting textured fabric surfaces where the texture is provided by the knit or woven structure. Fabrics that do not have a high surface area can also be produced following this method however they will not have as high wicking properties.

In accordance with aspects of the present invention, fabric fiber types ideally suited for this material are synthetics with low moisture absorption including polypropylene, polyester and nylon. Other fiber types may be used however moisture transport properties may be reduced.

In accordance with aspects of the present invention, in the instance that the directional water transport is for hot conditions, the fabric should have minimum heat retention to the wearer and may include other finishes including antimicrobial function, antihooking, UV protection, exterior heat reflection.

In accordance with aspects of the present invention fabric types applicable to this technology may be without stretch, low stretch and high stretch.

In accordance with aspects of the present invention, there is provided a thin layer fabric produced on a hydrophilic textile substrate that has directional water transport through the fabric structure from inside to out combined with a super-hydrophobic exterior fabric surface. The fabric is of a highly breathable nature and moisture transport control and super-hydrophobicity of the outer surface does not interfere with the breathability of the fabric.

In accordance with aspects of the present invention fabric types applicable to this technology may be without stretch, low stretch and high stretch.

In accordance with aspects of the present invention, fabric fiber types ideally suited for this material are natural fibers with high moisture absorption including wool and cotton. Other fiber types may be used however the fiber, yarn or fabric would need to be treated with a high wicking treatment before the moisture transport treatment was undertaken.

In accordance with aspects of the present invention, for hot conditions, the fabric should be selected to provide minimum heat retention to the wearer and may include other finishes including antimicrobial function, antihooking, UV protection, exterior heat reflection and self cleaning In accordance with aspects of the present invention, there is provided apparel for clothing an individual, comprising, on at least a portion of the apparel, a combination of layers constructed in accordance with the preceding paragraphs.

In accordance with aspects of the present invention, there is provided apparel for clothing an individual comprising of a high stretch inner garment combined with a low stretch outer shell, where the two garments together provide a thermal system where the outer layer acts as a water repellent insulating shell made in a fabric composite and the inner high stretch garment is a hollow core fleece with features thermal insulation and a heat reflection layer.

Coated Dual Knit Composites

It is an object of the present invention to provide a dual knitted fabric with directional moisture transfer and a moisture resistant surface. Preferably the fabric is a high stretch fabric with high breathability and moisture vapor transfer.

The fabric can be a thin double knit fabric construction but the present invention also covers knitted fabrics of thicker construction, fabrics made by weaving two fiber type yarns together in a double weave fabric or fabrics made by combining two fiber mats or fabrics or combination thereof together by nonwoven consolidation (including needle punching, laminating and hydroentanglement).

Knitted fabrics are a preferred manufacturing technique due to the high stretch provided by the fabric construction.

In accordance with aspects of the present invention, yarn fiber types ideally suited for the hydrophobic inner layer are synthetics with low moisture absorption including polypropylene, polyester and nylon. Other fiber types treated with a hydrophobic treatment may be used however moisture transport properties may be reduced. A supplementary hydrophobic treatment may applied as part of the coating system by vacuum plasma treatment.

In accordance with aspects of the present invention, yarn fiber types suited for the hyper-wicking outer layer are natural fibers with high moisture absorption including wool and cotton. Other moisture absorption fibers may be used as a substitute to these fibers and this includes synthetic fiber types treated with a hydrophilic treatment to make them hyper-wicking. A supplementary hydrophilic treatment may be applied as part of the coating system by vacuum plasma treatment.

In accordance with aspects of the present invention, there is provided a fabric that includes a range of specialty finishes that include antibacterial, antihook, UV protection, heat reflection, heat equilisation, oileophobic and self-cleaning.

In accordance with aspects of the present invention, this fabric can be used as a single layer in a textile garment comprising, or as a portion of a textile garment when used with a combination of other fabric and membrane layers.

Heat Reflecting Composites

It is an object of the present invention to provide a very thin coating of heat reflective material, or "reflective layer", applied to one or both sides of a supporting fabric via a plasma or vacuum deposition method. The coating can be ultra thin and applied in such a way that it adheres to the fibers of the supporting fabric and does not significantly impede the original properties of the supporting fabric, including handle, drape, stretch, air and moisture transportation and permeability. The chosen heat reflective material typically has a very high thermal conductivity, such as a metallic material. The supporting fabric may be a woven, non-woven or knit, and is chosen as appropriate for the application.

A preferred embodiment of the heat reflective material in the reflective layer is one that is metallic such as aluminum. Other materials and compounds may also be chosen, and with additional functional coatings applied into the layer.

This reflective layer can be applied to a single fabric that is used as part of a layer of a composite laminate joined together to form the desired material. The coating is not limited to one place within the composite structure. The reflective layer can also coated for protection against oxidization, which can be applied immediately after the vapor deposition metallization process, and can be a cross-linked polymer including polyurethane or acrylic binder.

The reflective layer may also perform other properties due to the selection of seed materials within the layer, for example silver used in combination with aluminum would include antibacterial/antimicrobial properties.

The reflective layer is then laminated, or bonded, to other layers to make a total composite laminate, including directly to a water-vapor-permeable, watertight substrate, of which can be made of either a non-porous or microporous structure like the pre-metalization membranes or substrates as described in U.S. Pat. Nos. 5,955,175 or 6,800,573.

The reflective layer can be single sided metalized, and the metallic side of this reflective layer can be bonded facing directly to the water-vapor-permeable, watertight substrate. This helps to insulate the metallic side from conductive heat transfer and convection. This may also hide the metallic lustre if no other laminates were used in the composite, if that was commercially preferred.

The supporting fabric of the reflective layer can also preferably be chosen to help maximize moisture transfer. Moisture transfer can also be effected by a hydrophobic treatment, or double sided hydrophobic/hydrophilic treatment of the substrate prior to metallization. This treatment can also be applied during the same vacuum plasma cleaning, vapor deposition manufacturing methods of the metallization. The improved moisture transfer of the reflective layer helps to build a composite laminate that has higher moisture permeability when combined with the water-vapor-permeable, watertight substrate.

The reflective layer can be single sided, bonded directly to the water-vapor-permeable, watertight substrate with the metallic side of the reflective layer facing away from the water-vapor-permeable, watertight substrate. This would help to promote emissivity of the reflective layer, and optimize heat reflection towards the body. This would also make the metallic lustre visible if no other laminates were used in the composite, if that was commercially preferred.

The supporting fabric of the reflective layer can also preferably be chosen to help maximize heat retention, such as a synthetic fleece, or synthetic hollow core fleece, or wool. This can also be treated with a hydrophobic treatment, or double sided hydrophobic/hydrophilic treatment, prior to metallization. This treatment can also be applied during the same vacuum plasma cleaning, vapor deposition manufacturing methods of the metallization. The improved moisture transfer and heat retention of the reflective layer helps to build a composite laminate that has excellent thermal attributes for cold conditions.

In another example composite, the heat reflection layer itself can be laminated or bonded with a second thermal heat retention layer of fabric that helps to further insulate the reflective layer from conductive heat transfer. This heat retention layer can be constructed from natural or synthetic fibers that include wool, cotton, polyester, polypropylene, nylon and blends of these fibers. These fibers can also optionally be hollow core to improve heat retention further. The heat retention layer is designed to provide the level of stretch desired in the end use garment, from high to no stretch, and may be made by knitting, weaving and non-woven construction methods.

In accordance with aspects of the invention, the side of the water-vapor-permeable, watertight substrate that is facing away from the reflective layer can be laminated with a fabric to protect it from the outside weather conditions, which can be, for example, made of a durable nylon with hydrophobic water repellency treatment. This hydrophobic water repellency treatment can be applied using vacuum plasma and vapor deposition to improve its fastness to the fabric.

The fabric may include other functional treatments obtained from fiber selection, fiber and fabric treatment or fabric coating. These functional finishes can include anti-microbial treatment, high wicking moisture management, hydrophobic water repellency, UV absorption, or self cleaning agent.

In accordance with aspects of the present invention, there is provided a composite material that includes a metallic (preferably aluminum or aluminum combined with silver) coating as a heat reflection layer combined with a thermal heat retention layer of synthetic fleece or wool. At least one of the layers preferably can include an antimicrobial treatment. Preferably the composite also includes an inner layer with high wicking moisture management. The metallic coating layer provides a conductive layer that will also help to equalize the heat across the body.

In accordance with aspects of the present invention, there is provided apparel for clothing an individual, comprising, on at least a portion of the apparel, a combination of layers constructed in accordance with the preceding paragraphs.

In accordance with aspects of the present invention, there is provided apparel for clothing an individual and the reflective coating may be used in a high stretch inner garment and within a low stretch outer shell. These types of garments may be used together to provide a thermal system where the outer layer acts as a water repellent insulating shell made in a fabric composite.

According to aspects of the invention, the present invention is directed to an infra-red reflecting composite comprising a moisture vapor permeable and substantially liquid impermeable non-porous substrate having first and second outer surfaces and at least one multi-layer coating on said first or second outer surface of the substrate, said multi-layer coating comprising a metal coating layer having a thickness between about 15 nanometers and 200 nanometers adjacent the first outer surface of the substrate where said metal is selected from the group consisting of aluminum, silver, copper, gold, tin, zinc, and their alloys, and an intermediate organic or in-organic coating layer of a composition containing a material selected from the group consisting of organic polymers, organic oligomers, sol gels and combinations thereof, having a thickness between about 0.02 micrometer and 2 micrometers, deposited on the outer surface of the moisture vapor permeable substrate between the substrate layer and the metal coating layer.

According to aspects of the invention, the composite of the present invention can have a multi-layer coating which further comprises an outer organic or in-organic coating layer of a composition containing a material selected from the group consisting of organic polymers, organic oligomers, sol-gels and combinations thereof, having a thickness between about 0.2 micrometer and 2.5 micrometers deposited on the metal layer, wherein the total combined thickness of the intermediate and outer organic or in-organic coating layers is no greater than about 2.5 micrometers.

Aspects of the invention are directed to a heat-reflecting flat composite comprising a moisture vapor permeable and substantially liquid impermeable non-porous substrate having first and second outer surfaces and at least one multi-layer coating comprising an intermediate organic coating layer of a composition containing a cross-linked polyacrylate having a thickness between about 0.02 micrometer and 1 micrometer deposited on the first outer surface of said substrate, a metal coating layer having a thickness between about 15 nanometers and 200 nanometers deposited on said intermediate organic coating layer, said metal selected from the group consisting of aluminum, silver, copper, gold, tin, zinc, and their alloys, and optionally an outer organic coating layer of a composition containing a cross-linked polyacrylate having a thickness between about 0.2 micrometer and 1 micrometer deposited on the metal layer, wherein the multi-layer coating substantially covers the outer surface of the substrate.

According to aspects of the invention, the metal layer can additionally have increased corrosion resistance by oxidizing the surface of a metal coating with an oxygen-containing plasma to form a self protecting metal oxide coating.

Functionalization of the various coatings can also be optionally included, and alternative embodiments of the present invention may also have extra material layers in the composite. Any layers may be coated for extra functionalization during the same plasma treated vacuum vapor deposition process, to be hydrophobic, hydrophilic, or antibacterial, for example.

Insulated Heat Reflecting Composites

It is an object of the present invention to provide fabrics made for apparel, in various composites, which are constructed such that there is at least one metal layer, forming a radiant barrier for heat loss via radiation from the human body.

According to aspects of the invention, the metal layer is covered by a coating designed to help insulate the metal layer from heat loss via conduction, while maintaining low emissivity and optimizing the infrared reflectance. This coating can be optimized for infra red transparency, preferably within the range primarily radiated by human body, which is dominant in the 12 micrometer wavelength and typically in the infrared spectrum between 7 micrometer and 14 micrometers. The coating can be a porous textile promoting an air gap, or it can be a thinly coated polymer, oligomer, or sol-gel at a width that maintains moisture vapor permeability.

According to aspects of the invention, additional moisture build up on the metal layer is reduced, thus helping maintain low emissivity, via hydrophilic and/or hydrophobic functionalization of layers within the composite.

According to aspects of the invention, a manufacturing technique is provided for layering and building the composite fabric is via plasma treated, vacuum vapor deposition, including flash evaporation of the metallic, organic and inorganic components.

In addition the metal layer can have increased corrosion resistance by oxidizing the surface of a metal coating with an oxygen-containing plasma to form a self protective metal oxide coating. Functionalization of the various coatings can also be optionally included, and alternative embodiments of the present invention may also have extra material layers in the composite. Any layer may be coated for functionalization, preferably during the same plasma treated vacuum vapor deposition process, and preferably via vapor deposition utilizing flash evaporation, to be flame retardant, UV absorbing, self cleaning, hydrophobic, hydrophilic, or antibacterial.

BRIEF DESCRIPTION OF THE DRAWINGS

FIGS. 5a and 5b illustrate additional example apparel according to aspects of the invention.

FIG. 7 illustrates another example method according to the invention.

FIG. 8 illustrates an example composite according to aspects of the invention, incorporating wicking features.

FIG. 9 illustrates another example composite according to aspects of the invention, incorporating wicking features.

FIGS. 10a and 10b illustrate example apparel incorporating composites according to aspects of the invention.

FIG. 11 illustrates an example method according to the invention.

FIG. 12 illustrates another example method according to the invention.

FIGS. 14a and 14b illustrate an example system of two garments incorporating composites according to aspects of the invention.

FIG. 15 illustrates an example method according to the invention.

FIG. 22 illustrates an example method according to the invention.

FIG. 23 illustrates another example method according to the invention.

DETAILED DESCRIPTION OF THE INVENTION

Introduction

Figure 1:
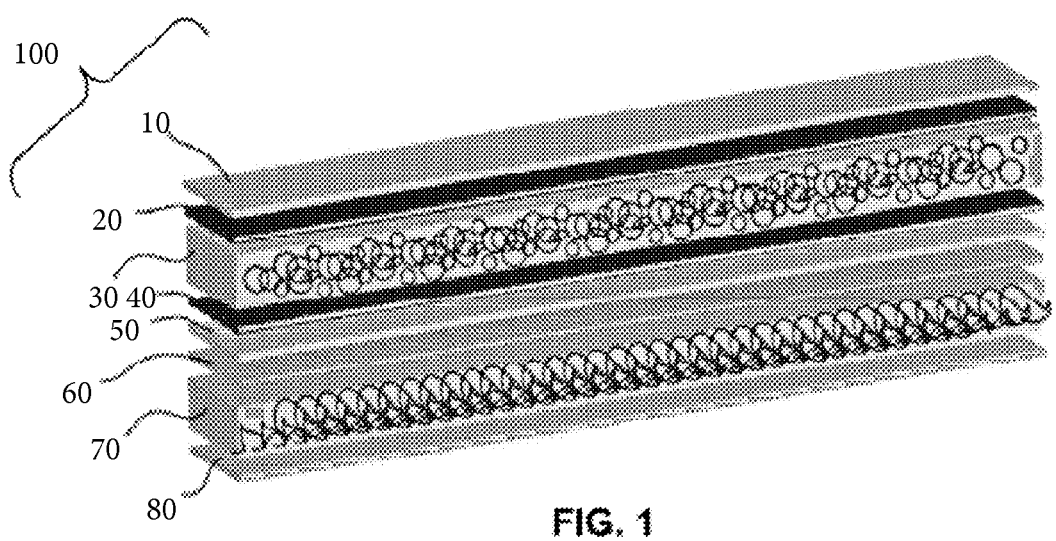
FIG. 1 illustrates an example composite according to aspects of the invention.

Various aspects of the present invention address the deficiencies of the known prior art. More specifically, aspects of the invention are directed to a carefully selected combination of specific fibers, fabrics and material layers having properties that provide improved garment performance characteristics, while at the same time providing comfort to the wearer.

Example apparel according to aspects of the invention provides individuals involved in water sport activities such as sailing, kayaking, surfing, boating, water skiing, wakeboarding, kite surfing, and sail boarding with active wear having increased performance and function to deal with cold and wet weather conditions while involved in such activities.

The apparel also provides individuals involved in outdoor activities such as snowboarding, snow skiing, hiking, climbing, biking, golf etc., with active wear with increased performance and function to deal with cold and wet weather conditions while involved in such activities.

Aspects of the invention are directed to a combination of nonwoven, foam-like, and fabric-like materials resulting from the latest technological advances in a manner unknown in the prior art.

Optionally, apparel according to the invention can be conveniently worn as two garments together or separately, with an internal thermal system provided in a garment with high stretch for improved body heat retention and the outer thermal system provided weather insulation in a garment as an outer shell.

Example apparel according to aspects of the invention provides a directional moisture transport system for thin layer no stretch, low stretch and high stretch garments. The apparel of the preferred embodiments provide individuals involved in sport activities such as summer and winter sports (such as skiing, snowboarding, skating, or the like), water sports (such as sailing, kayaking, surfing, boating, water skiing, wakeboarding, kite surfing, sail boarding, or the like), outdoor sports (such as hiking, mountain climbing, bush walking, camping, or the like) and other activities where increased performance and function is required to deal with high body moisture. The apparel can also be applied to standard casual wear and main street fashion as the addition of the directional moisture transport layer in the preferred embodiments makes fabrics with better moisture transport control than currently available, making it practical to reduce body discomfort from wetting when in a hot or sweat inducing environment/activity. It should be understood that these embodiments are set forth for purposes of explanation only and are not to be interpreted as the only application of the present invention.

Example apparel according to aspects of the invention provides a high wicking thermal garment system with improved body heat retention and a highly hydrophobic surface treatment while retaining good wicking away and transfer of body moisture, breathability, and antimicrobial function. The apparel of the preferred embodiments provide a combination of improved thermal systems while retaining good stretch for improved body heat retention though form fitting garments.

Example apparel according to aspects of the invention provides a variation where the apparel can be conveniently worn as two garments together or separately, with the internal thermal system provided in a garment with high stretch for improved body heat retention and the outer thermal system provided weather insulation in a garment as an outer shell.

Example apparel according to aspects of the invention provides individuals involved in sport and other activities where increased performance and function is required to deal with high body moisture. The apparel can also be applied to standard casual wear and main street fashion.

Example apparel according to aspects of the invention provides a number of material options with reflective thermal coatings for improved body heat retention. The fabrics may be used as a next to skin layer, or a middle thermal system between an external protective shell and next to skin heat retention layer, or as an outer external protective shell. The apparel of the preferred embodiments provide a combination of improved thermal systems while retaining good breathability and transportation of body moisture, and antimicrobial function.

Example apparel according to aspects of the invention provides individuals involved in sport activities such as winter sports (such as skiing, snowboarding, skating, or the like), water sports (such as sailing, kayaking, surfing, boating, water skiing, wakeboarding, kite surfing, sail boarding, or the like), outdoor sports (such as hiking, mountain climbing, bush walking, camping, or the like) and other sports with increased performance and function to deal with cold or hot weather conditions in such activities. The apparel can also be applied to standard casual wear and main street fashion as the addition of the reflective layer in the preferred embodiments allows thinner fabrics with higher heat retention properties than currently available, making it practical to wear a reduced amount of clothing in winter.

It is understood that the various examples according to aspects of the invention are set forth for purposes of explanation only and are not intended to be interpreted as the only application of the present invention.

Water Resistant Breathable Stretchable Composites

FIG. 1. generally illustrates an example composite 100 according to aspects of the present invention, made up of a first (outer) weather layer 10, a second water resistant layer 20, a third insulation layer 30, a fourth water resistant layer 40, a fifth protective layer 50, a sixth heat reflective layer 60, a seventh thermal layer 70 and an eighth (inner) heat conductive/wicking layer 80. On some preferable options one or more layers are eliminated. These layers can be attached to each other either by an adhesive (breathable adhesive if necessary), mechanical bonding (or stitch bonding), lamination (flame or adhesive lamination, for example), welding or a combination of these applications.

An adhesive film that eliminates stitching by SewFree™ may be used to bond fabrics and seams, pocket areas or collars or adhesive bonding by Bemis or the like can attach the seams. Mechanical bonding can be performed using nylon, elastine, SPANDEX™ or LYCRA™ thread or the fibers inclusive in the nonwoven structure or the like. Other equivalent methods may also be employed.

A detailed discussion of the materials optionally used in these layers follows. Also follows are some specific examples with some layers eliminated.

The outer material 10 is typically a Nylon™ fabric with a durable water repellent treatment. Example exterior shell performance fabrics and materials include those manufactured by Schoeller™, Amaterrace™, Polartec™, Gore Enterprises™, Nam Liong™, Toray™, Teijin Shojin™ and the like. The outer layer 10 can be treated for durable water repellency using a Teflon™ treatment or the like or encapsulation or nano-technology such as described in U.S. patent application Ser. No. 10/002,513 or NANOSPHERE™ technology by Schoeller Textil™ or the like.

The water resistant membrane layer 20 can be a thin water resistant breathable membrane like those made available by Toray™ (for example Dermizax™), Schoeller™, 3M™, etc. or it can be a non-breathable foam layer such as a thin neoprene (preferably 0.5 mm). This layer protects the other inner layers from water under pressure, and can be eliminated if other layers already provide water resistance.

The insulation layer 30 material is chosen dependant on the performance required. If the performance of the material is designed to have good isolation between the outside temperature and the inside body heat, then this layer 30 should have a very low thermal conductivity. Air has a relatively low conductivity (0.025 W/mK at 20 degrees C. sea level atmospheric pressure), so materials with a high component of air are a good choice.

Layer 30 can be, for example, a 3D warp knit mesh, providing high component of air as a good insulator of heat conduction, and hence good thermal isolation between outer and inner layers. A 3D textile of this kind is usually constructed in three layers and includes a top layer and a bottom layer with "spacer fibers" between them which determine the thickness of the 3D textile. The thickness of such standard commercial 3D textiles can range from 1 mm to over 20 mm. Polyester or polyamide fibers are typically used for the 3D textiles. Special sweat-absorbing materials may also be incorporated in the 3D textiles. Known examples of such 3D textiles include "AirX 3D Spacer Fabric™" from the company Tytex™, "Spacetec™" from Heathcoat™, "XD-Spacer Fabrics™" from Baltex™, and "3 Mesh™" from Muller-Textil™.

Insulation layer 30 can also preferably be a composite of a silicon foam or aerogel, such as those provided by Aspen Aerogels™, or an Aerogel/PTFE composite insulating material like that described by Gore Enterprises™ in U.S. Pat. No. 7,118,801. Aerogel is the solid with the lowest thermal conductivity, and can provide higher performance of insulation with a thinner material. It is brittle in standard silicon foam form, and can also release toxic dust. Forms by Aspen Aerogel™ and Gore Enterprises™, however, are new forms that can be used embedded in apparel, and it is expected that further improvements will develop. It is important to only utilize an aerogel that has low dusting or is protected from the skin for toxicity.

Insulation layer 30 can also be a perforated neoprene of various thicknesses, from 0.5 mm to 7 mm or higher. The perforations can be of various diameters and also spaced at various density. More perforations and/or larger perforations per area of neoprene, or similar foam, will increase the proportion of air in the layer and hence decrease the thermal conductivity and increase the insulation effect.

The water resistant membrane layer 40 can be a thin, water resistant breathable membrane like those available by Toray™ (for example Dermizax™), Schoeller™, 3M, etc. or it can be a non-breathable foam layer such as a thin neoprene (preferably 0.5 mm). This layer combines with layer 20 to protect layer 30 from water under pressure, but can be eliminated if other layers already provide water resistance. If layer 30 is a 3D textile or other non hydrophobic textile that can get saturated with water then layers 20 and 40 are needed for water resistant protection. If layer 30 is an aerogel, such as PYROGEL 2250 by Aspen Aerogel™ (2 mm thick and low thermal conductivity of 0.015 W/mK at 20 degrees C. sea level atmospheric pressure) then the hydrophobic qualities of the aerogel itself help to eliminate the need for layer 40, and (optionally) layer 20 as well.

Layer 50 is an optional inside protective fabric for layer 40, if required. It can be a Tricot Mesh, for example, to protect layer 40 if it is a thin water resistant breathable membrane, such as Toray™ Dermizax™ or the like.

Layer 60 is designed to reflect heat back to the body. The layer is metalized, preferably with aluminum or silver, to make it infrared reflective. Aluminum foil, for example, has been traditionally used in industrial insulation applications to great effect for this same function. In apparel a silver or aluminum layer can similarly be applied. In order for this layer to also have moisture transfer ability, so the total garment can still breathe, the silver or aluminum, or compound of similar thermal attributes, can be applied as a powder added to a breathable adhesive that connects adjacent layers in total composite material.

Layer 70 is designed as a layer that will wick moisture from the skin, or from layer 80, pull the moisture up and spread it out for transfer to outer layers for evaporation. It is also design to retain heat and act as a thermal layer. A good construction is a synthetic hollow core fleece, such that heat can interface to a maximum surface area to internally trapped air in each fiber, similar to the way natural fibers work in the fur of animals such as possums. This layer 70 can also be treated to have an antimicrobial function, using either natural (for example bamboo fibers) or synthetic (for example silver) agents.

Layer 80 is optionally added to aid in the transfer of heat across the body, such that hot areas equalize with colder areas efficiently. To do this the layer is mixed with fibers that have high thermal conductivity. This layer is ideally made from a material that is also excellent at wicking moisture away from the skin. An example would be a thin synthetic layer such as filament polyester that is good for wicking yet also constructed with a mesh of silver, aluminum, or similar thermal conductive thread. This layer 80 can also be treated to have an antimicrobial function, using either natural (for example bamboo fibers) or synthetic (for example silver) agents.

Examples of composite fabrics according to aspects of the invention include the following:

Example 1: Per FIG. 1. An example fabric was constructed made up of layers 10, 20, 30, 40, 50, 60, 70 and 80 with the following respective materials in each layer: Layer 10 is nylon, preferably with a high density micro weave for durability and rip stop strength, where the fibers are treated for very high water repellency before knitting the material, using the latest nano technology methods; Layer 20 is a water resistant membrane that is monolithic with high water resistant specification, and using solid state diffusion for moisture vapor transport and breathability, chosen from those manufactured by either Toray™, Amaterrace™, 3M™ or the like; Layer 30 is a thin 3 mm 3D warp knit mesh, such as the spacer fabrics made by Tytex™, Heathcoat™, or Baltex™; Layer 40 is a membrane the same as Layer 20, Layer 50 is a Tricot Mesh to protect Layer 40, Layer 60 is a silver powder added to the adhesive to bond layer 70 which is a carbon hollow core fleece or similar and layer 80 is thin polypropelene final layer with antimicrobial treatment and threads of aluminum, or similar, mesh.

Figure 3:
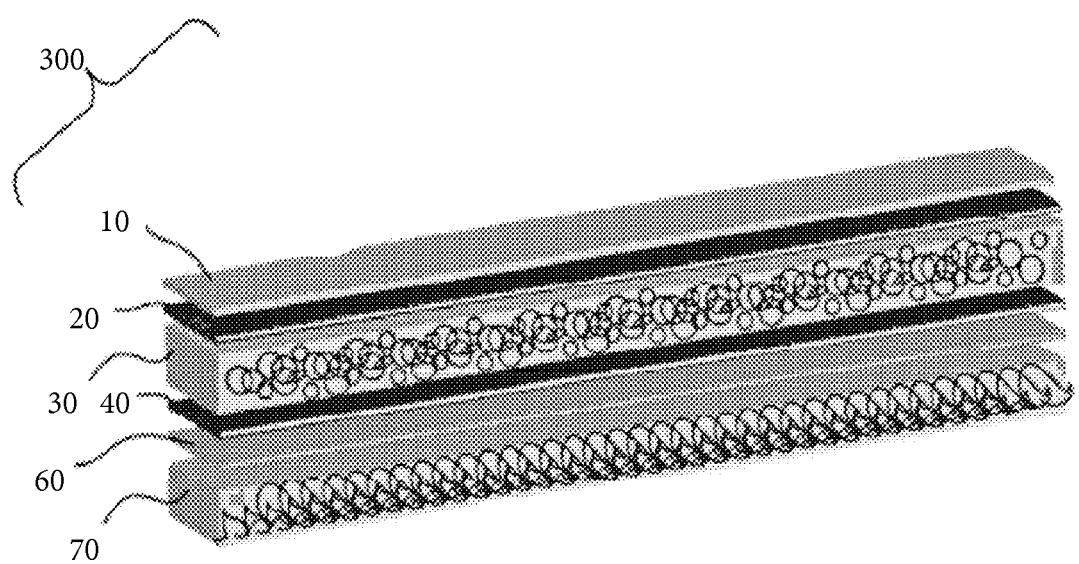
FIG. 3 illustrates another example composite according to aspects of the invention.

Example 2: Per FIG. 3. an example fabric 300 made up of layers 10, 20, 30, 40, 60 and 70 with the following respective materials in each layer: Outer nylon with super durable water repellency coating, thin neoprene (thickness of 0.5 mm), 3D warp knitted mesh (such as those made by company Tytex™, Heathcoat™, Baltex™, or Muller-Textil™), thin neoprene (thickness of 0.5 mm), adhesive combined with metallic particles (with aluminum or silver elements), and a nylon hollow core fleece with antimicrobial treatment.

Example 3: Per FIG. 3, an example fabric made up of layers 10, 20, 30, 40, 60 and 70 with the following respective materials: Layer 10 of nylon with super durable water repellency, Layer 20 a monolithic water resistant breathable membrane such as Dermizax™ from Toray™, Layer 30 a perforated 3 mm neoprene, with perforations of 1 mm diameter and spaced about 5 or so per square cm, Layer 40 is the same as Layer 20, Layer 60 is a metallic silver or aluminum powder added to the adhesive to layer 70, and layer 70 is a nylon hollow core fleece with antimicrobial treatment and high wicking properties. Each layer and its bonding method in this fabric is of high 4 way stretch and is breathable so the total function of the fabric is one with very high thermal insulation to the outside temperature, body heat reflection internally, and good breathability. The fabric can build tight fitting apparel excellent for performance sports, and also a replacement for wetsuits made for cold weather conditions.

Example 4: Per FIG. 2. An example composite 200 comprising an outer fabric 91 made of layers 10, 20, 30, 40, 50 and 60, where Layer 10 is nylon with super durable water repellency, Layer 20 a monolithic water resistant breathable membrane such as Dermizax™ from Toray™, Layer 30 is a thin 3 mm 3D warp knit mesh, such as the spacer fabrics made by Tytex™, Heathcoat™, or Baltex™; Layer 40 is a membrane the same as Layer 20, Layer 50 is a Tricot Mesh to protect Layer 40, Layer 60 is a reflective lining and can be a very thin coating of powdered aluminum, or the metallic finishes as applied to neoprenes available by Sea Mate™, or similar. The total outer fabric does not have to be very high stretch, but all layers are preferably be breathable. An inner fabric 92 is made of layers 10, 60, 70, 80, with the following materials; Layer 10 is a high stretch nylon or spandex, layer 60 is an optional extra heat reflecting layer made with a metallic silver or aluminum powder added to the adhesive to layer 70, layer 70 is a nylon hollow core fleece with antimicrobial treatment and high wicking properties and Layer 80 is an optional thin high wicking polypropylene final layer with antimicrobial treatment and threads of aluminum, or similar, mesh. The inner fabric is tight fitting, high stretch, light weight and acts as the main thermal wear to retain heat close to the body, while the outer fabric provides outside weather insulation, durability and water repellency.

All inner lining materials may include anti-microbial FOSSHIELD™ silver fibers and grooved 4-8 DG fibers by Foss Manufacturing™ or the like or X-STATIC™ products or the like.

The examples presented above are various composite combinations presented in preferred embodiments. The technical composites can be realized on different parts in different types of apparel or as the entire garment. Other variations are also possible given the range of combinations that are possible. It may be noted in the preferred embodiments that there are no stated specified rates of breathability or moisture transfer. The selected products and performance category in the product line determine the selected breathable and moisture transfer rates. The MVT and breathable rates are developed by the selected fibers, foams and materials for these technical composites product systems and are determined by the performance level and product company.

Any layers above can incorporate microfiber technology. This area is rapidly developing and changing, creating the potential for improved performance of products as newer materials are properly utilized. These new products are part of rapidly developing technical textile technology. The present invention employs a combination of fabrics, foam layers, nonwovens, spacer fabrics, breathable membranes, encapsulated technology, structurally woven water repellent fabrics, or water resistant film coatings in such combinations that increase the performance of the products in which they are used as well as increase the breathability. There are many new membranes on the market to select from with excellent breathable and moisture transfer properties.

Garments manufactured in accordance with preferred embodiments will typically use a stitching method that is water resistant. Many of the stitching methods commonly used today for wet weather apparel can be used, with taped seams. The seams may also be sonically bonded. If the Garment also needs to have high stretch then a combination of flatlock and liquid glue can be used, or in the case of a fabric made with foam of sufficient thickness, the seams may be glued and blind stitched.

Figure 4A:
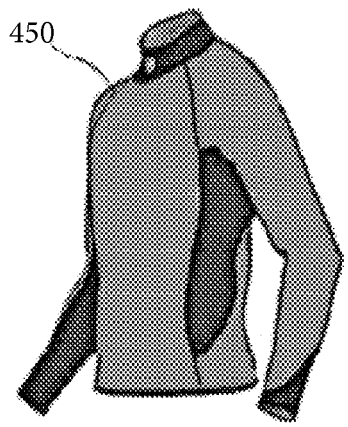
FIGS. 4a, 4b and 4c illustrate apparel incorporating composites according to aspects of the invention.
Figure 4B:
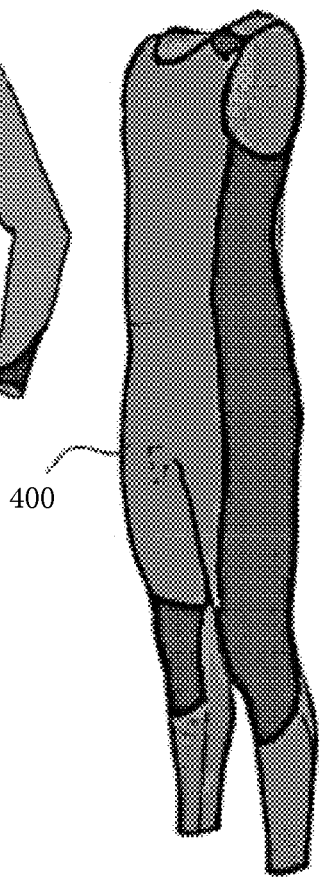
Figure 4C:
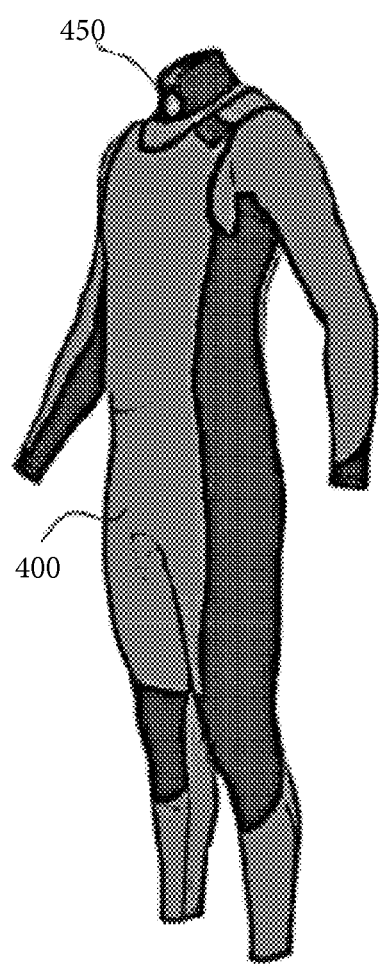

FIGS. 4a, 4b and 4c illustrate example performance apparel made using the fabrics of the preferred embodiments, which combine a long john style garment 400 as a replacement to a wetsuit, with a Veclro™ shoulder entry, and a technical top 450 made of a similar fabric. The combination of the two creates a system having good flexibility around the shoulders, and a doubling of the fabric around the chest and back. This combination also provides total body coverage with no zips, which makes it more flexible, less expensive, and more durable.

The apparel illustrated in FIGS. 4a, 4b and 4c represent an example of a specific style, and although not specifically illustrated, all types of apparel can be manufactured according to the present invention. The application of this invention to other types of apparel may easily be accomplished by one with ordinary skill in the art.

Figure 2:
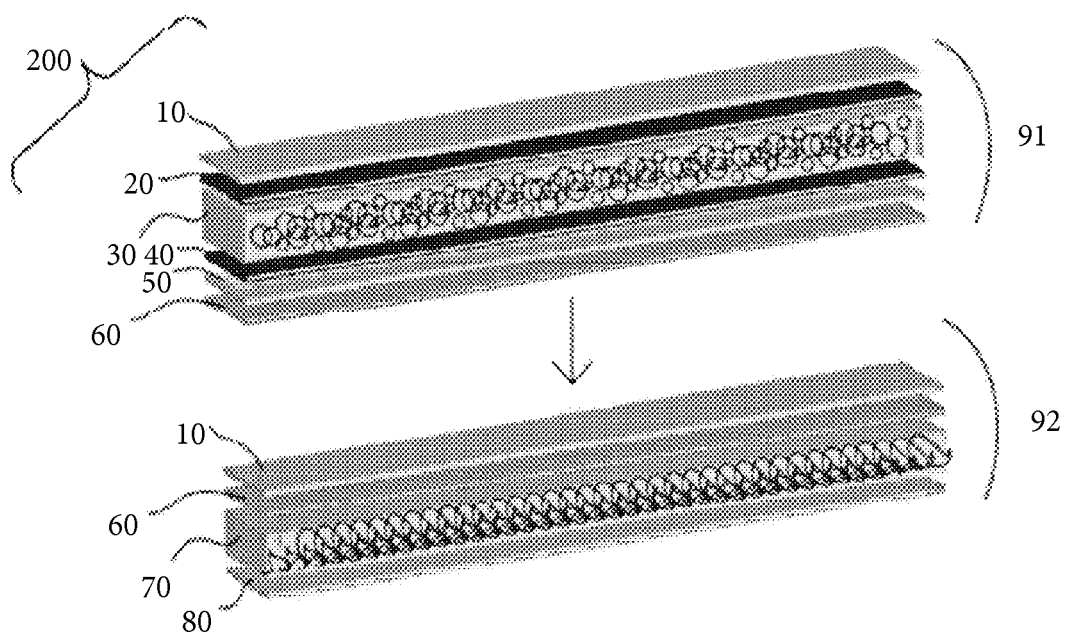
FIG. 2 illustrates a cross sectional view of an example combination of two example composites according to aspects of the invention.

FIG. 5 illustrates an example set of garments using the system of fabrics of FIG. 2, made using two technical tops, one worn under the other. The inner garment 550 comprises inner fabric 92 (FIG. 2) and is stretchable and close fitting to maximize the effect of the heat retention fabric. The outer garment 500 comprises outer fabric 91 (FIG. 2) and is a looser fitting jacket with less stretch, which is durable and weather resistant providing insulation and shield to outside climate.

Other example garments would be dry suits incorporating composites according to the invention for use under very cold conditions, using latex seals to make them completely water resistant. This may be in a top and pant combination, with a watertight seal around the waist and no heavy zips or a total full body dry suit, with a water resistant zip entry, typically across the back.

If the cuffs of an example garment were to require water resistant seals, the cuffs may incorporate latex, (preferably DURASEAL™ from Precision Dippings™ with higher resistance to ozone and UV.)

Figure 6:
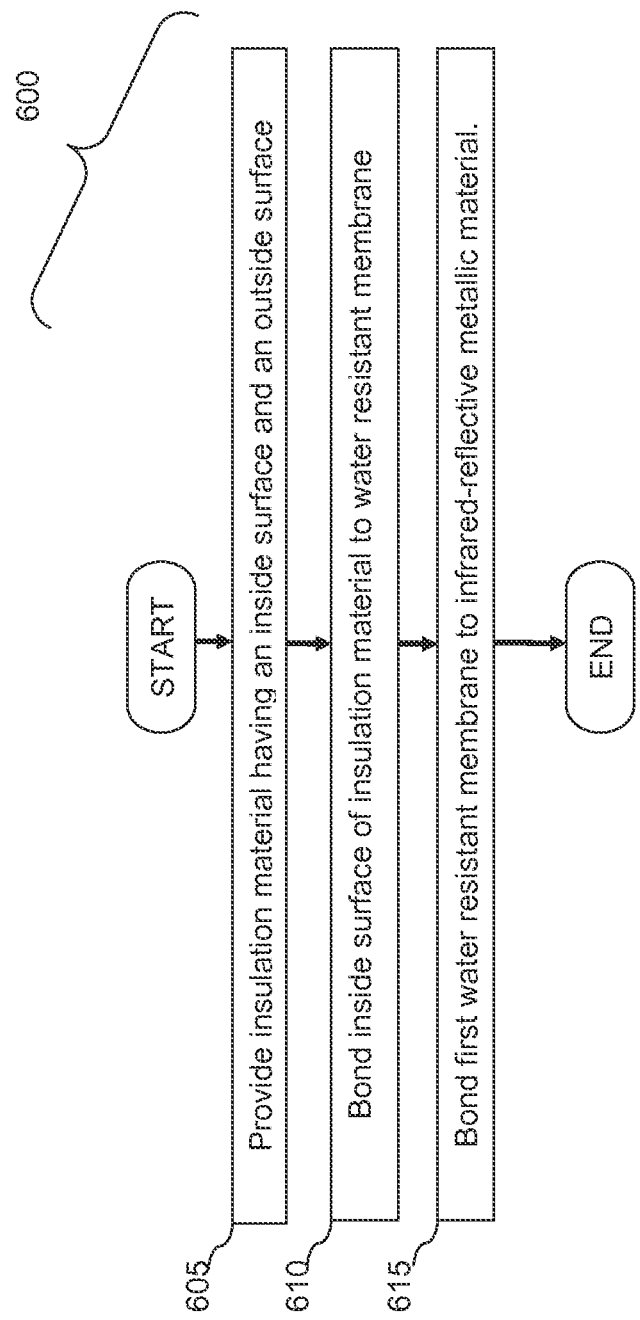
FIG. 6 illustrates an example method according to the invention.

FIG. 6 illustrates an example method 600 according to the invention. Each step may be performed using materials and methods as further described with respect to FIGS. 1-5, and optionally, using any other materials and methods disclosed herein.

In a first step 605, a layer of insulation material having an inside surface and an outside surface is provided.

In a second step 610, the inside surface of the layer of insulation material is covered by a first water resistant membrane.

In a third step 615, the first water resistant membrane is covered by a layer of infrared-reflective metallic material.

FIG. 7 illustrates another example method 700 according to the invention. Each step may be performed using materials and methods as further described with respect to FIGS. 1-5, and optionally, using any other materials and methods disclosed herein.

In a first step 710, a layer of insulation material having an inside surface and an outside surface is provided. (30)

In a second step 720, the layer of insulation material is bonded to a first water resistant membrane. (40)

In a third step 730, the first water resistant membrane is bonded to a protective material. (50)

In a fourth step 740, the protective material is covered by a layer of infrared-reflective metallic material. (60)

In a fifth step 750, the outside surface of the layer of insulation material is covered by a second water resistant membrane. (20)

In a sixth step 760, the second water resistant membrane is covered by a weather-resistant material (10).

In a seventh step 770, a thermal layer (70) is provided having an obverse surface and a reverse surface.

In an eighth optional step 780, a wicking and thermal layer(80) is bonded to the reverse surface of the thermal layer (70).

In a ninth alternate step 790, the obverse surface of the thermal layer (70) is bonded to the infrared-reflective metallic surface.

In a tenth alternate step 795, the obverse surface of the thermal layer (70) is bonded to a second protective layer (RENUMBER IN FIG. 2) (10').

Directional Water Transmission Composites

FIG. 8 Illustrates an example directional water transmission composite 800 according to aspects of the present invention, having a first (outer) functional coating 810, a second hyper wicking coating 820, a third hydrophobic fabric layer 840, a fourth hydrophobic coating 860 and a fifth functional coating 870. Coating 810 and 820 are interchangeable in their location and coating 860 and 870 are interchangeable in their location. Optionally, one or more of the functional coatings are eliminated.

A detailed discussion of the materials which may be used in these layers follows. Also follows are some specific examples with some layers eliminated.

The outer coating 810 is typically a functional layer provided by vacuum plasma vapor deposition which may be single or multifunctional in behavior. The function of this coating can include antibacterial, self cleaning, UV protection, antihook, or infrared-reflective functions.

Coating 810 can also be alternatively applied as a coating by pad/cure/dry, screen printing, dip coating, spray coating, foam coating, blade coating, chemical vapor deposition or other vacuum deposition.

The hyper-wicking coating 820 is typically a thin coating that provides extremely high wicking of the fabric surface in order to spread moisture passed through the fabric for the means of increasing moisture evaporation. This coating is produced by vacuum plasma vapor deposition and is only applied to the outer surface of the supporting fabric. The coating is thin enough so that it does not impact the original hand feel, breathability or stretch of the supporting fabric.

Coating 820 may also be alternatively applied as a coating by pad/cure/dry, screen printing, dip coating, spray coating, foam coating, blade coating, chemical vapor deposition or other vacuum deposition.

Coating 810 and 820 may be applied at the same time to ensure that both coating functional properties are present on the outer fabric surface.

The hydrophobic fabric layer 840 is preferably but not limited to a thin knitted or woven textile and is the supporting fabric for the coatings 810 and 820. The fabric layer 840 is highly textured on its exterior surface in order to enhance exterior surface area. The fabric can be manufactured from a synthetic material such as nylon, polyester and polypropylene but is not limited to these fiber types.

Layer 840 can also be manufactured from a natural fiber that has had a chemical treatment to make its entire surface hydrophobic however without hydrophobic treatment the directional moisture transport still work but not as efficiently as with a hydrophobic fiber.

Layer 840 can be made from a material that has no stretch, low stretch or high stretch depending on the finished garment that it will be used in.

The hydrophobic coating 860 is typically a thin coating that makes the fabric surface hydrophobic. In order for the directional water transport to occur the inside layer of the fabric must be hydrophobic and the outside layer of the fabric hydrophilic. This coating is produced by vacuum plasma vapor deposition and is only applied to the outer surface of the fabric. The coating is thin enough so that it does not impact the original hand feel or stretch of the supporting fabric 840.

The coating layer 860 is not required if the supporting fabric 40 has sufficient hydrophobic properties to enable the one directional water transport properties however it may be required to be applied if the functional material used in coating 870 changes the hydrophobic nature of the supporting fabric 840.

Coating 860 may also be alternatively applied as a coating by pad/cure/dry, screen printing, dip coating, spray coating, foam coating, blade coating, chemical vapor deposition or other vacuum deposition.

Coating layer 870 is typically a functional layer provided by vacuum plasma vapor deposition which may be single or multifunctional in behavior. The function of this coating can include antibacterial, self cleaning, UV protection, antihook and IR reflective.

Coating 870 may also be alternatively applied as a coating by pad/cure/dry, screen printing, dip coating, spray coating, foam coating, blade coating, chemical vapor deposition or other vacuum deposition.

Coating 860 and 870 may be applied at the same time to ensure that both coating functional properties are present on the inner fabric surface Coatings 810, 820, 860 and 870 in FIG. 1 can all be applied to the supporting fabric 840 using a vacuum plasma chemical vapor deposition method, such that the supporting fabric 840 has different combined coatings on either side of it, with the desired functionality.

FIG. 9 illustrates coatings according to aspects of the present invention, namely a first (outer) functional coating 910, a second super-hydrophobic coating 930, a third hydrophilic supporting fabric layer 950, a fourth hydrophobic coating 960 and a fifth functional coating 970. Coating 910 and 930 are interchangeable in their location and coating 960 and 970 are interchangeable in their location. On some preferable options one or more of the functional coatings are eliminated.

In FIG. 9, coating 910, 960 and 970 are the same as coatings 810, 860 and 870 described above regarding FIG. 8, however coating 930 and supporting fabric layer 950 are different from coatings 830 and 850 and have been described below.

The super-hydrophobic coating 930 is typically a thin coating that provides extremely high contact angle for water droplets on the fabric surface in order resist wetting of the fabric surface. This coating is produced by vacuum plasma vapor deposition and is only applied to the outer surface of the fabric. The coating is thin enough so that it does not impact the hand feel or stretch of the supporting fabric 950.

Coating 930 may also be alternatively applied as a coating by pad/cure/dry, screen printing, dip coating, spray coating, foam coating, blade coating, chemical vapor deposition or other vacuum deposition.

Coating 910 and 930 may be applied at the same time to ensure that both coating functional properties are present on the outer fabric surface.

The hydrophilic fabric layer 950 may be a light weight knitted or woven textile fabric. The fabric is highly textured on its exterior surface in order to enhance exterior surface area. The fabric is manufactured from a material with very high hydrophilic/wicking properties. This may be achieved by natural fibers including wool and cotton or by a synthetic material that has had a wicking treatment applied to the fiber, yarn or fabric before the coating process. Synthetic fibers that may be used include nylon, polyester and polypropylene but is not limited to these fiber types.

Layer 950 can be made from a material that has no stretch, low stretch or high stretch depending on the finished garment that it will be used in.

Coatings 910, 930, 960 and 970 in FIG. 9 can all be applied to the supporting fabric 950 using a vacuum plasma chemical vapor deposition method, such that the supporting fabric 950 has different combined coatings on either side of it, with the desired functionality.

Examples of composite fabrics according to aspects of the invention include the following Example 1: Per FIG. 8, An example fabric 800 can be constructed of coatings and layers 810, 820, 840, 860 and 870 with the following respective materials in each layer: Layer 810 is coating that has UV protection of zinc oxide nano-particles applied by vacuum plasma chemical deposition; Layer 820 is a hydrophilic vacuum plasma deposition coating that is applied at the same time as layer 810; Layer 840 is nylon and spandex mix with high stretch, Layer 860 is a coating that has hydrophobic properties applied by chemical vapor deposition; Layer 870 is an antimicrobial coating applied by vacuum plasma deposition at the same time as layer 860; This material may be used for high stretch, next-to-skin sports garments for a hot and wet environment where high wicking rate is important.

Example 2: Per FIG 8, An example fabric can be constructed of coatings and layers 810', 820', 840', 860' and 870' with the following respective materials in each layer: Layer 810' is coating that has UV protection of zinc oxide nanoparticles applied by vacuum plasma chemical deposition; Layer 820' is a hydrophilic vacuum plasma deposition coating that is applied at the same time as layer 810'; Layer 840' is polyester pique fabric with medium levels of stretch, Layer 860' is a coating that has hydrophobic properties applied by vacuum plasma chemical deposition; Layer 870' is an antimicrobial coating applied by vacuum plasma chemical deposition at the same time as layer 860'; This material may be used for next-to-skin t-shirt or polo-shirt style sports or casual wear garments for a hot and/or wet environment where high wicking rate is important.

Example 3. Per FIG. 9 an example fabric can be constructed of coatings and layers 910, 930, 950, 960 and 970 with the following respective materials in each layer: Layer 910 is coating that has UV protection of zinc oxide nanoparticles applied by vacuum plasma chemical deposition; Layer 930 is a super-hydrophobic vacuum plasma deposition coating that is applied at the same time as layer 910; Layer 940 is a chlorinated machine wash treated wool single jersey fabric with high wicking rate and high natural stretch, Layer 960 is a coating that has hydrophobic properties applied by chemical vapor deposition; Layer 970 is an antimicrobial coating applied by vacuum plasma deposition at the same time as layer 960; This material may be used for high stretch, next-to-skin sports garments for a hot and/or wet environment where high wicking rate and water repellency are important.

Example 4: FIGS. 10a and 10b illustrate an example set of garments, made using two technical tops, one worn under the other. The inner garment with material 1000 is stretchable and is chosen as a base layer with close fitting to maximize the effect of the heat retention fabric and is composed of a high wicking fabric as per examples 1, 2 or 3. The outer garment 1050 is a looser fitting jacket with less stretch that is durable and weather resistant providing insulation and protection against the outside climate.

FIG. 11 illustrates an example method 1100 according to the invention. Each step may be performed using materials and methods as further described with respect to FIGS. 8-10, and optionally, using any other materials and methods disclosed herein.

In a first step 1105, a hydrophobic fabric layer is provided, having an inside surface and an outside surface.

In a second alternative step, the outside surface may be coated either 1110 with a hydrophilic wicking material which is subsequently coated 1115 with a functional material; 1120 with a functional material only; or, 1125 with both a hydrophilic wicking material and a functional material applied simultaneously.

In a third alternative step, the inside surface may be coated either 1130 with a hydrophobic material, the hydrophobic material subsequently coated with a functional material; 1140 with a functional material only; or, 1145 with both a hydrophobic material and a functional material applied simultaneously.

FIG. 12 illustrates an example method 1200 according to the invention. Each step may be performed using materials and methods further described with respect to FIGS. 8-10, and optionally, using any other materials and methods disclosed herein.

In a first step 1205, a hydrophilic fabric layer is provided, having an inside surface and an outside surface.

In a second alternative step, the outside surface may be coated either 1210 with a superhydrophobic material which is subsequently coated 1215 with a functional material; 1220 with a functional material only; or, 1225 with both a superhydrophobic material and a functional material applied simultaneously.

In a third alternative step, the inside surface may be coated either 1230 with a hydrophobic material which is subsequently coated with a functional material; 1240 with a functional material only; or, 1245 with both a hydrophobic material and a functional material applied simultaneously.

Coated Dual Knit Composites

Figure 13:
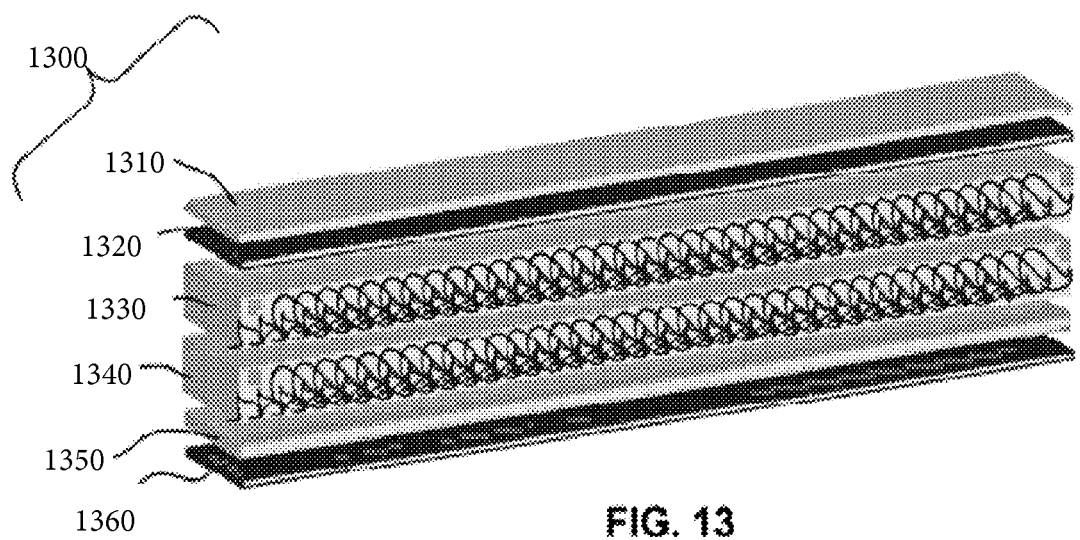
FIG. 13 illustrates a composite according to aspects of the invention

FIG. 13 illustrates an example composite according to the invention which includes a first (outer) functional layer 1310, a second hydrophobic layer 1320, a third hydrophilic/wicking fabric layer 1330, a fourth hydrophobic fabric layer 1340, a fifth hydrophobic layer 1350 and a sixth functional layer 1360. Layer 1310 and 1320 are interchangeable in their location or can be applied together and layer 1350 and 1360 are interchangeable in their location or can be applied together. Optionally, one or more of the functional coatings may be eliminated.

A detailed discussion of the materials which may be used in these layers follows. Also follows are some specific examples with some layers eliminated.

The outer coating 1310 is typically a functional layer provided by vacuum plasma vapor deposition which may be single or multifunctional in behavior. The function of this coating can include antibacterial, self cleaning, UV protection, antihook, or IR reflective functions.

Coating 1310 may also be alternatively applied as a coating by pad/cure/dry, screen printing, dip coating, spray coating, foam coating, blade coating, chemical vapor deposition or other vacuum deposition.

Coating 1320 is typically a thin coating that provides a highly hydrophobic function, with a high contact angle for water droplets on the fabric surface in order resist wetting of the fabric surface. This coating is produced by vacuum plasma vapor deposition and is only applied to the outer surface of the fabric. The coating is thin enough so that it does not impact the handle of the fiber.

Coating 1320 may also be alternatively applied as a coating by pad/cure/dry, screen printing, dip coating, spray coating, foam coating, blade coating, chemical vapor deposition or other vacuum deposition.

Coating 1310 and 1320 may be applied at the same time to ensure that both coating functional properties are present on the outer fabric surface.

The hydrophilic fabric layer 1330 is preferably but not limited to a light weight knitted, woven or non-woven textile fabric. The fabric is highly textured on its exterior surface in order to enhance exterior surface area. The fabric is manufactured from a material with very high hydrophilic/wicking properties. This may be achieved by natural fibers including wool and cotton or by a synthetic material that has had a wicking treatment applied to the fiber, yarn or fabric before the coating process. Synthetic fibers that may be used include nylon, polyester and polypropylene but is not limited to these fiber types.

Layer 1330 can be made from a material that has no stretch, low stretch or high stretch depending on the finished garment that it will be used in.

The hydrophobic fabric layer 1340 is may be a thin knitted, woven or non-woven textile fabric. The fabric is manufactured from a synthetic material such as nylon, polyester and polypropylene but is not limited to these fiber types.

Layer 1340 can be manufactured from a natural fiber that has had a chemical treatment to make its entire surface hydrophobic however without hydrophobic treatment the directional moisture transport will still work but not as efficiently as with a hydrophobic fiber.

Layer 1340 can be made from a material that has no stretch, low stretch or high stretch depending on the finished garment that it will be used in.

Layer 1330 and layer 1340 can be combined using a double knit construction to provide superior breathability, moisture transfer, durability, drape and handle when compared to a laminated structure. This effect detailed in this invention may also be achieved by a dual layer laminated structure with the same properties and coatings detailed for a dual knit fabric.

The hydrophobic coating 1350 is typically a thin coating that makes the fabric surface hydrophobic. In order for the directional water transport to occur the inside layer of the fabric must be hydrophobic and the outside layer of the fabric hydrophilic. This coating is produced by vacuum plasma vapor deposition and is only applied to the outer surface of the fabric. The coating is thin enough so that it does not impact the handle of the fiber.

The coating layer 1350 is not required if the fiber has sufficient hydrophobic properties to enable one-directional water transport properties however it may be required to be applied if the functional material used in coating 1360 changes the hydrophobic nature of the fiber.

Coating 1350 may also be alternatively applied as a coating by pad/cure/dry, screen printing, dip coating, spray coating, foam coating, blade coating, chemical vapor deposition or other vacuum deposition.

Coating layer 1360 is typically a functional layer provided by vacuum plasma vapor deposition which may be single or multifunctional in behavior. The function of this coating can include antibacterial, self cleaning, UV protection, antihook, or IR reflective functions.

Coating 1360 may also be alternatively applied as a coating by pad/cure/dry, screen printing, dip coating, spray coating, foam coating, blade coating, chemical vapor deposition or other vacuum deposition.

Coating 1350 and 1360 may be applied at the same time to ensure that the functional properties of both coatings are present on the inner fabric surface.

Examples of composite fabrics according to aspects of the invention include the following Example 1: Per FIG. 13b, an example fabric may be constructed with layers 1310, 1320, 1330, 1340, 1350 and 1360 having the following respective materials in each layer: Layer 1310 is a UV protective coating containing zinc oxide nano-particles applied by vacuum plasma chemical deposition; Layer 1320 is a super-hydrophobic vacuum plasma deposition coating that is applied at the same time as layer 1310; Layer 1330 is double knitted from a chlorine/polymer shrink resist treated wool yarn with high moisture absorption. Layer 1340 is the second layer of the double knit fabric and is knitted from a polypropylene hollow core fiber yarn and spandex mix yarn to provide the dual knit fabric with high stretch, Layer 1350 is a coating that has hydrophobic properties, and is applied by chemical vapor deposition; Layer 1360 is an antimicrobial coating, and is applied by vacuum plasma deposition at the same time as layer 1350; This material may be useful in high stretch, next-to-skin sports garments for hot and wet environments where a high moisture wicking rate is important.

The examples presented above are various composite combinations presented in preferred embodiments. The technical composites can be realized on different parts in different types of apparel or as the entire garment. Other variations are also possible given the range of combinations that are possible. It should be noted in the preferred embodiments described herein that there are no stated specified rates of breathability or moisture transfer. The selected products and performance category in the product line determine the selected breathable and moisture transfer rates. The MVT and breathable rates are developed by the selected fibers, foams and materials for these technical composites product systems and are determined by the performance level and product company.

Any layers of a composite according to the invention including those described above may incorporate microfiber technology. This area is rapidly developing and changing, creating the potential for improved performance of products as newer materials are properly utilized. These new products are part of rapidly developing technical textile technology.

FIGS. 14a and 14b illustrate an example set of garments, made using two technical tops, one worn under the other. The inner garment with material 1400 is stretchable and is chosen as a base layer with close fitting to maximize the effect of the heat retention fabric and is composed of a high wicking fabric like that described with respect to example 1. The outer garment 1450 is a more loose fitting jacket with less stretch, that is durable and weather resistant providing insulation and shield to outside climate.

FIG. 15 illustrates an example method 1500 according to the invention. Each step may be performed using materials and methods as further described with respect to FIGS. 13-14, and optionally, using any other materials and methods disclosed herein.

In a first step 1505, a hydrophilic fabric layer is provided, having an inside surface and an outside surface.

In a second step 1510, a hydrophobic fabric layer is provided, having an inside and an outside surface.

In a third step 1515, the inside surface of the hydrophilic layer is oriented toward the outside surface of the hydrophobic layer In a fourth step 1520, the hydrophilic layer and hydrophobic layer are combined.

In a fifth alternative step, either 1530 the outside surface of the hydrophilic layer is coated with hydrophobic material, and 1535 the hydrophobic material is subsequently coated with a functional material; or, 1540 the outside surface of the hydrophilic layer is coated with both a hydrophobic material and a functional material simultaneously.

In a sixth alternative step, either 1545 the inside surface of the hydrophobic layer is coated with a hydrophobic material and 1550 the hydrophobic material is subsequently coated with a functional material; or, 1555 the inside surface of the hydrophobic layer is coated with both a hydrophobic material and a functional material simultaneously.

Heat Reflecting Composites

Figure 16:
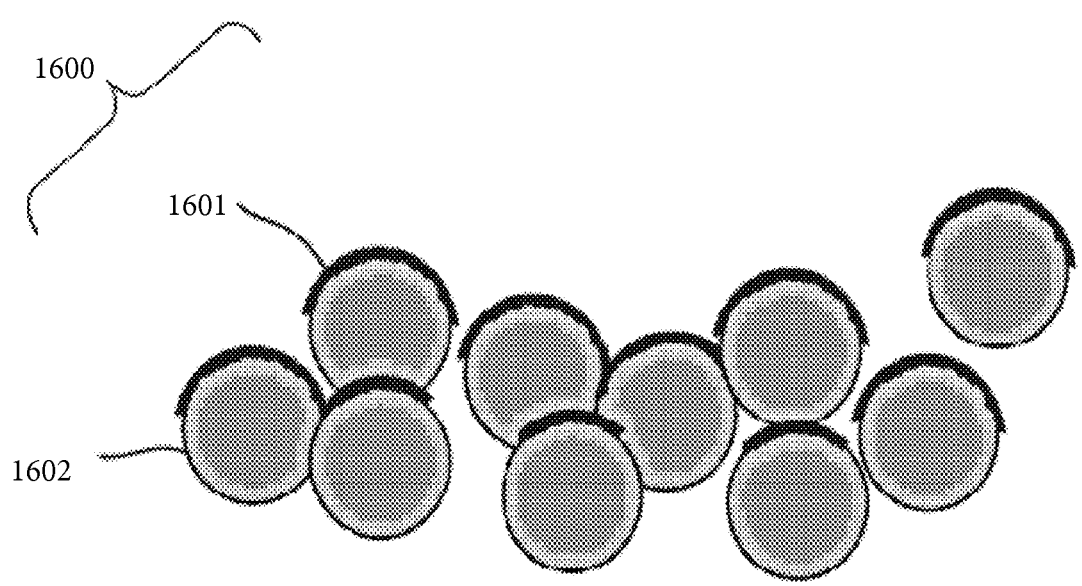
FIG. 16 illustrates a cross sectional view of an example reflective layer and its supporting fabric fibers, according to aspects of the invention.

FIG. 16 Generally illustrates an example of a heat reflection layer 1600 according to aspects of the present invention. A coating 1601, shown in cross section as applied to the fibers 1602 of the supporting fabric. This reflective coating 1601 effectively applies to one side of the textile fibers 1602. In this preferred embodiment the reflective layer is one that is comprised of a metallic material, preferably aluminum, applied to the fibers of a supporting fabric via a plasma vacuum deposition method. In this case the coating 1601 to the base fabric fibers 1602 are very thin, typically 10 nm to 200 nm, and can be coated to one side of the fabric without significantly impeding the fabrics handle, drape, air and moisture transport properties.

Figure 17A:
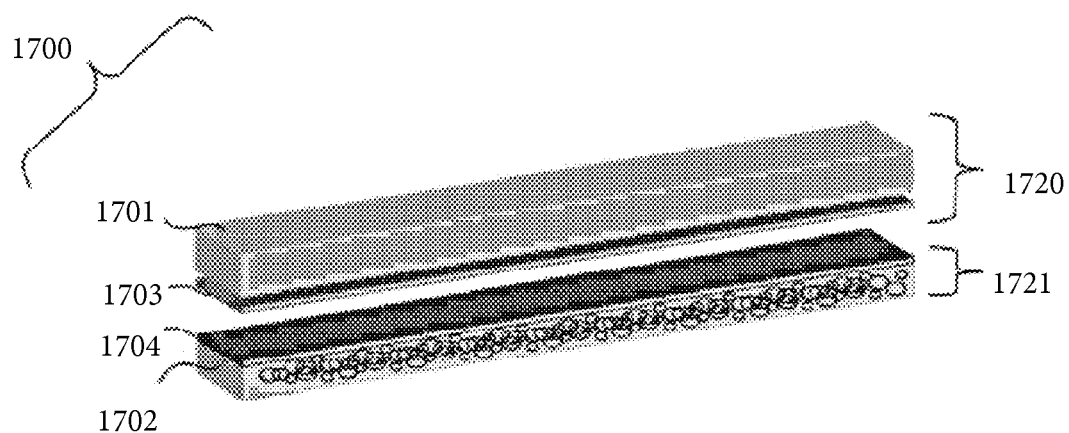
FIGS. 17a and 17b illustrate example composites according to aspects of the invention.
Figure 17B:
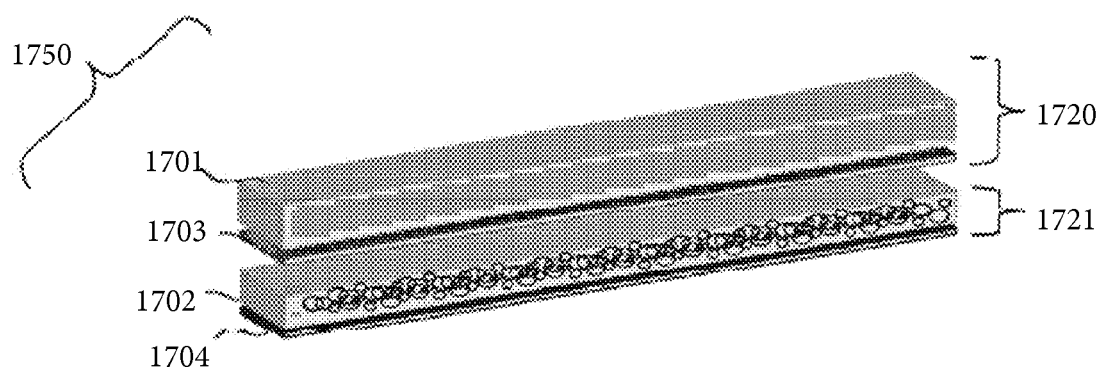

FIGS. 17a and 17b generally illustrate a composite laminate according to the invention in two forms (1700 and 1750) with outer weather layer 1720 laminated to a reflective layer 1721. The outer weather layer 1720 is made up of an outer fabric 1701 combined with a watertight, water-vapor-permeable membrane 1703. The reflective layer 1721 is made up of a supporting fabric 1702 that is metalized 1704. Layer 1702 is metalized onto 1704 per the vacuum plasma vapor deposition method described with respect to FIG. 16. In FIG. 17a, the metallization 1704 is facing the membrane 1703 and in FIG. 17b the metallization 1704 is facing away from the membrane 1703 upon lamination or bonding.

With the metallization 1704 facing the membrane 1703 as in FIG. 17a, the metallization 1704 is more protected from convection, helping to minimize conductive heat transfer. With the metallization 1704 facing away from the membrane 1703 as in FIG. 17b, the emissivity of the composite laminate 1750 is higher helping to improve heat reflection. In both constructions of FIG. 17a and FIG. 17b the composite laminates 1700 and 1750 can be constructed to be a durable, watertight, heat reflective material with good water-vapor-permeability.

In the following description of the various composition, layers of material within any given clothing layer can be attached to each other either by an adhesive (breathable adhesive if desired), mechanical bonding (or stitch bonding), lamination (flame or adhesive lamination, for example), welding or a combination of these applications or coated using either atmospheric or vacuum plasma deposition.

A detailed discussion of the materials and composites structure which may be used in these clothing layers follows. Also follows are some specific examples.

According to aspects of the invention, layer 1701 is a protective shell and is typically a nylon fabric with a durable water repellent coating or treatment. For example exterior shell performance fabrics and materials manufactured by Schoeller™, Amaterrace™, Polartec™, Gore Enterprises™, Nam Liong™, Toray™, Teijin Shojin™ and the like. This fabric of 1701 can be treated for durable water repellency using a Teflon™ treatment or the like. Preferably, any water repellent treatment to this outer fabric 1701 is coated to be more durable using a plasma vacuum deposition method. Layer 1701 can also be optionally treated for UV absorption to help protect the garment from UV degredation, and also optionally treated with self cleaning agents. All these treatments can be combined together and applied during the same plasma vacuum deposition. Commonly the protective shell 1701 also has a water resistant membrane 1703 layer in its composite structure to create the outer weather layer 1720, like those available by Gore Laboratories™ Toray™ (for example Dermizax™), Schoeller™, 3M, etc. This water resistant membrane protects the other inner layers from water under pressure, and can be eliminated if other layers already provide water resistance.

The reflective layer 1721, made of supporting fabric 1702 with metalized layer 1704 is designed to reflect heat back to the body or reflect heat away from the body. Layer 1704 may be applied to the fabric via vapor plasma deposition. The material to be metallically coated is placed under vacuum (between $2.7 \times 10^{-5}$ and $2.7 \times 10^{-6}$ kPa). The surface is first cleaned and its surface energy increased by glow discharge plasma in a controlled gas environment (gases used for plasma gas treatment include hydrogen, helium, nitrogen, argon and ammonia). The surface may then be coated by a polymeric undercoating (typically 0.2-2 µm thick) of a suitable material including polyurethane or polyacrylate or may be directly coated by a metal. The polymer undercoat is cured by application of heat, light or plasma depending on the cross-linking system utilized. If a polymer undercoat is used then the polymer undercoat is plasma treated to increase surface energy before coating with a metal layer. The metal layer is typically applied from a molten metal bath within the high vacuum environment. The metallic layer is typically 10 to 200 nm thick. The metal layer is coated by a protective layer, preferably a polymeric coating to stop oxidation by the same system adopted for undercoating. A pigment color can also be optionally applied with the protective layer.

The thin metallic coating layers onto the filaments of 1702 such that gaps between the filaments in the textile remain, similar to the structure shown diagrammatically in FIG. 16, such that the breathability and moisture vapor transfer characteristics are preserved. The metallization can also have antibacterial properties with the addition of a silver component to the aluminum. This coating of aluminum can be 10 to 200 nm thick using the vacuum plasma deposition method, and can be applied to just one side of the supporting fabric 1702. The result is a fabric having a metalized coating adhered to the fibers on one side of the fabric such that it will have high heat reflection on one side, while still being able to breathe and stretch.

According to aspects of the invention, the supporting fabric 1702 is preferably a knit or woven textile that gives good flat continuous coverage for the metallization in order to optimize the reflectivity of infra red heat, preferably also optimized in the range typical of the emission of infra red from the human body of between 7 and 14 micrometers. The total breathability of the reflective layer 1721 should be compatible with the outer weather layer 1720.

According to aspects of the invention, the supporting fabric 1702 is chosen for its wicking and moisture management qualities, and may be a treated hydrophobic and dual coated hydrophobic/hydrophilic fabric. This treatment can be optimally applied during the vacuum plasma vapor deposition metallization application.

Layer 1704 may also be applied to both sides of the supporting fabric 1702. The material can be but is not limited to reflective metals including aluminum, zinc, silver, gold, copper and titanium.

Layer 1704 can also be alternatively applied as a coating by pad/cure/dry, screen printing, dip coating, spray coating, foam coating, blade coating, chemical vapor deposition or other vacuum deposition. The reflective material may also be applied as a powder added to a breathable adhesive that connects adjacent layers in the total composite material. The layer may be made be either breathable or non-breathable.

The supporting fabrics 1701 and 1702 are chosen with insulation characteristics dependant on the performance required. If the performance of the material is designed to have good isolation between the outside temperature and the inside body heat, then these supporting fabrics 1701 or 1702 should have a very low thermal conductivity. Air has a relatively low conductivity (0.025 W/mK at 20 degrees C. sea level atmospheric pressure), so materials with high air content may be desired, for example.

The supporting fabrics 1702 can be, for example, a 3D warp knit mesh, providing high component of air as a good insulator of heat conduction, and hence good thermal isolation between outer and inner layers. A 3D textile of this kind is usually constructed in three layers and includes a top layer and a bottom layer with "spacer fibers" between them which determine the thickness of the 3D textile. The thickness of such standard commercial 3D textiles can range from 1 mm to over 20 mm. Polyester or polyamide fibers are typically used for the 3D textiles. Special sweat-absorbing materials may also be incorporated in the 3D textiles.

Known examples of such 3D textiles include "AirX 3D Spacer Fabric™" from the company Tytex™, "Spacetec™" from Heathcoat, "XD-Spacer Fabrics™" from Baltex™, and "3 Mesh™" from Muller-Textil™.

The supporting fabrics 1702 can also be a composite of a silicon foam or aerogel, like those provided by Aspen Aerogels, or an Aerogel/PTFE composite insulating material like that described by Gore Enterprises in U.S. Pat. No. 7,118,801. Aerogel is the solid with the lowest thermal conductivity, and can provide higher performance of insulation with a thinner material. It is brittle in standard silicon foam form, and can also release toxic dust. Forms by Aspen Aerogel™ and Gore Enterprises™, however, are new forms that can be used embedded in apparel, and it is expected that further improvements will develop. It is important to only utilize an aerogel that has low dusting or is protected from the skin for toxicity.

The supporting fabric 1702 can also be a perforated neoprene of various thickness, from 0.5 mm to 7 mm or higher. The perforations can be of various diameter and also spaced at various density. More perforations and/or larger perforations per area of neoprene, or similar foam, will increase the proportion of air in the layer and hence decrease the thermal conductivity and increase the insulation effect.

The supporting fabrics 1702 may also be of a textile structure made by knitting, weaving or nonwoven and made from fibers with a hollow core or high air retention structure. These fibers can be either synthetic or natural and may include fibers such as 3DG™, camel hair, merino wool, or possum fur.

The supporting fabrics 1702 can also be designed as a layer that is comfortable for next to skin wear. This fabric will wick moisture from the skin pull the moisture up and spread it out for transfer to outer layers for evaporation. It is also designed to retain heat and act as a thermal layer. A good construction is a synthetic hollow core fleece, such that heat can interface to a maximum surface area to internally trapped air in each fiber, similar to the way natural fibers work in the fur of animals such as possums. The supporting fabrics 1702 can also be treated to have an antimicrobial function, using either natural (for example bamboo fibers) or synthetic (for example silver) agents. Another good heat retention material option is wool, which naturally absorbs some water that can help keep the skin dry and retain heat in the right circumstances.

The supporting fabrics 1702 can be coated with agents to promote moisture transport, with high wicking from the skin and transport to outer layers, in combination with other agents for antimicrobial function.

Examples of composite fabrics according to aspects of the invention include the following Example 1: An Example fabric 1700 made up of outer weather layer 1720 and reflective layer 1721, laminated together. The outer weather layer 1720 is composed of a durable nylon fabric 1701 treated for water repellency with a Teflon coating, laminated with a non-porous water-vapor-permeable monolithic membrane 1703. The reflective layer 1721 is a supporting fabric of knitted polypropylene 1702 coated with aluminum 1704 via a vapor deposition method such that the aluminum coating is very thin, between 10 nm and 200 nm and on one side of the knitted polypropylene, maintaining the original space between the fibers of 1702 and hence breathability. The aluminum coating 1704 is protected from oxidation by an acrylic coating with a super-hydrophobic finish. The reflective layer 1721 is laminated to the outer weather layer 1720 such that the metalized aluminum side of layer 1721 faces the membrane 1703.

Example 2: Is the same as example 1 except the reflective layer 1721 is laminated to the outer weather layer 1720 with the metal side of 1721 facing away from the outer layer 1720.

Example 3: Is the same as example 1 or 2 except the supporting fabric 1702 of the reflective layer is replaced with a double knit fabric with polypropylene hollow core yarn on the next to skin side with antimicrobial treatment and hydrophobic surface finish and the outside of the fabric is a wool yarn with hydrophilic properties.

Example 4: Is the same as example 1, 2, or 3 except the membrane 1703 used is a microporous, air-permeable, moisture vapor transmissive, water resistant and drapeable polymeric membrane, such as a stretched PTFE fabric material available under the registered trademark GORE-TEXT™.

Example 5: Is the same as example 1 or 2 or 4 except the supporting fabric 1702 of the reflective layer is replaced with a merino wool, synthetic fleece or hollow core synthetic fleece.

Garments manufactured in accordance with preferred embodiments will typically use a stitching method that is necessary depending on the water resistant and stretch of the fabric. Many of the stitching methods commonly used for wet weather apparel can be used, with taped seams if necessary for water resistance. The seams may also be sonically bonded. If the Garment also needs to have high stretch then a combination of flatlock and liquid glue can be used, or in the case of a fabric made with foam of sufficient thickness, the seams may be glued and blind stitched. Otherwise if the garments manufactured in accordance with preferred embodiments are to be worn as first layer next to the skin or second layer tight to the skin like thermal wear apparel, without high water resistance as it is a base layer worn under other garments that are already water resistant, then the stitching can be flatlock stitching, or other standard stitching to allow for the correct stretch in the fabric.

Figure 18:
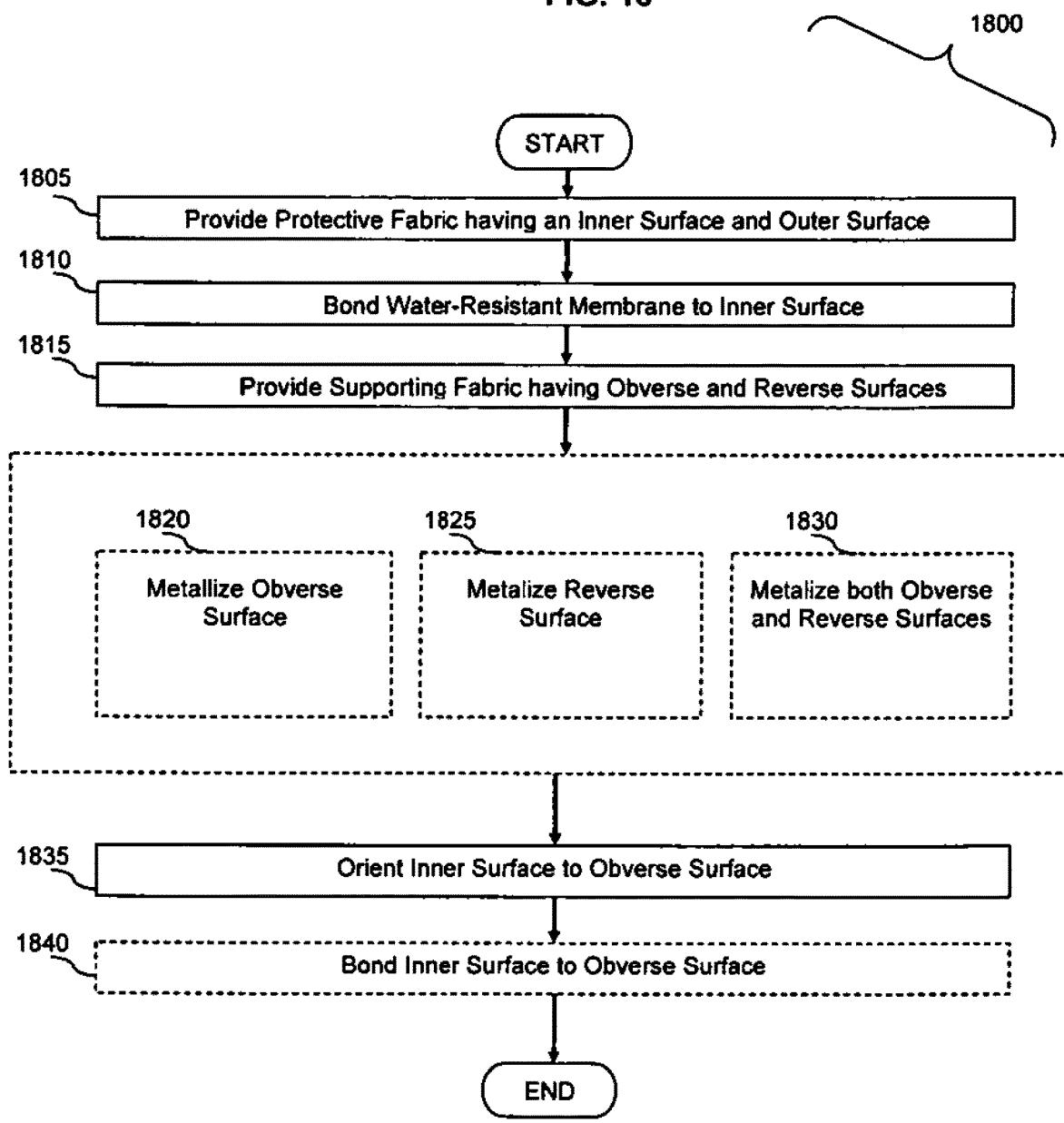
FIG. 18 illustrates an example method according to the invention.

FIG. 18 illustrates an example method 1800 according to the invention. Each step may be performed using materials and methods as further described with respect to FIGS. 16-17, and optionally, using any other materials and methods disclosed herein.

In a first step 1805, a protective fabric is provided having an inner surface and an outer surface.

In a second step 1810, a water resistant membrane is bonded to the inner surface.

In a third step 1815, a supporting fabric is provided having an obverse surface and a reverse surface.

In an alternative fourth step, either 1820 the obverse surface is metalized to be infrared-reflective; 1825 the reverse surface is metalized to be infrared-reflective; or, 1830 both the obverse surface and the reverse surface are metalized to be infrared-reflective.

In a fifth step 1835, the inner surface is oriented to face the obverse surface.

In an optional sixth step 1840, the inner surface is bonded to the obverse surface.

Further aspects of the present invention relate to an infra-red reflective, substantially liquid impermeable, moisture vapor permeable composite formed by coating at least one side of a substantially liquid impermeable, moisture vapor permeable non-porous substrate with at least one metal layer and at least one thin organic or in-organic coating layer deposited on the surface of the substrate between the substrate layer and the metal coating layer. The coatings are preferably formed under vacuum using vapor deposition techniques under conditions that substantially coat the substrate without significantly reducing its moisture vapor permeability.

According to aspects of the present invention, the composite is formed by coating at least one side of a substantially liquid impermeable, moisture vapor permeable non-porous substrate with at least one metal layer and at least one thin organic or in-organic coating layer deposited on the surface of the substrate between the substrate layer and the metal coating layer and at least one thin organic or in-organic coating layer on the surface of the metal layer opposite the substrate layer. The coatings are preferably formed under vacuum using vapor deposition techniques under conditions that substantially coat the substrate without significantly reducing its moisture vapor permeability.

In a preferred embodiment of the invention, the substrate is a non-porous, moisture vapor permeable and substantially liquid impermeable monolithic film.

An example composite according to aspects of the present invention includes the following layers: Substrate/L1/M, Substrate/L1/M/L2, and Substrate/L1/M/L2/M/L3, Substrate/L1/M/IL2, Substrate/IL1/M/IL2 etc. where Substrate is a moisture vapor permeable, substantially liquid impermeable substrate layer, M is a low emissivity metal layer and L1, L2, and L3 are organic coating layers comprising an organic polymer or organic oligomer, or blends thereof and IL1 and IL2 are inorganic coating layers comprising a sol-gel. The abbreviations "L1" and "IL1" are used herein to refer to an intermediate organic coating layer that is deposited on a surface of the substrate layer prior to depositing a metal layer thereon. The composite substrates optionally include at least one outer organic or in-organic coating layer overlying the metal layer such as IL2, L2 and L3 in the above-described structures. In composite substrate structures having more than one metal layer, individual metal layers can be formed from the same or different metal and can have the same or different thickness. Similarly, in structures having more than one organic or in-organic coating layer, the individual organic or in-organic coating layers can have the same or different composition and/or thickness. Each metal layer can comprise more than one adjacent metal layers wherein the adjacent metal layers can be the same or different. Similarly, each organic or in-organic layer can comprise more than one adjacent organic or in-organic layer, wherein the adjacent organic or in-organic layers can be the same or different. The substrate layer can be coated on one side, as in the structures described above, or on both sides such as in the following structures: L1/Substrate/L1/M/L2, L2/M/L1/Substrate/L1/M/L2, IL2/Substrate/L1/M/IL2, IL2/M/IL1/Substrate/IL1/M/IL2 etc.

According to aspects of the present invention, at least one textile fabric such as a woven, non-woven, or knitted fabric is applied to the substrate prior to coating with said organic or in-organic layers and metal layers, where said textile fabric consists of nylon, polyester, wool, cotton, or other fiber and the said textile is combined with the substrate by process of lamination. Lamination can occur by using an adhesive, or a melt film, or a melt fiber between surfaces or a stitching/needling process.

According to aspects of the present invention, a textile fabric such as a woven, non-woven, or knitted fabric is applied to the substrate surface opposite the metal layer prior to coating with said organic or in-organic layers and metal layers and an additional organic or in-organic coating is deposited on the surface of said textile fabric opposite to the substrate layer to form the following composites: L2/Textile/Substrate/L1/M/L2, IL2/Textile/Substrate/IL1/M/IL2, etc. Where said textile fabric consists of nylon, polyester, wool or other fiber and said organic or in-organic coating is selected from the group consisting of organic polymers, organic oligomers, sol-gels and combinations thereof and the coatings are preferably formed under vacuum using vapor deposition techniques.

According to aspects of the present invention, a textile fabric such as a woven, non-woven, or knitted fabric is applied to the substrate surface adjacent to the organic or in-organic layers and metal layers prior to coating with said organic or in-organic layers and metal layers to form the following composites: Substrate/Textile/L1/M, Substrate/Textile/L1/M/L2, etc. where the said textile consists of nylon, polyester, wool, cotton or other fiber and has filaments that are spaced apart. Spacing of the filaments ensures that a portion of the substrate surface is accessible so that said applied organic or in-organic coatings and metal coatings adhere to both the underlying substrate and the textile filaments According to aspects of the present invention, at least one textile fabric such as a woven, non-woven, or knitted fabric is applied to the substrate after coating with said organic or in-organic layers and metal layers, where the said textile is combined with the substrate by process of lamination. Lamination can occur by using an adhesive, or a melt film, or a melt fiber between surfaces or a stitching/needling process.

According to aspects of the present invention, the said organic or in-organic coatings comprise one or more functional components. Functionalities include hydrophilic coatings from monomers functionalized with groups including hydroxyl, carboxyl, sulphonic, amino, amido and ether. Hydrophobic coatings from monomers and/or sol-gels with fluorinated functional groups and/or monomers and/or sol-gels that create nanostructure on the textile surface. Antimicrobial coatings from a monomer and/or sol-gels with antimicrobial functional groups and/or encapsulated antimicrobial agents (including chlorinated aromatic compounds and naturally occurring antimicrobials). Fire retardant coatings from monomers and/or sol-gels with a brominated functional group. Self cleaning coatings from monomers and/or sol gels that have photo-catalytically active chemicals present (including zinc oxide, titanium dioxide, tungsten dioxide and other metal oxides). Ultraviolet protective coating from monomers and/or sol-gels that contain UV absorbing agents (including highly conjugated organic compounds and metal oxide compounds).

Moisture vapor permeable monolithic (non-porous) films are formed from a polymeric material that can be extruded as a thin, continuous, moisture vapor permeable, and substantially liquid impermeable film. The film layer can be extruded directly onto a first nonwoven, woven or knitted layer using conventional extrusion coating methods. Preferably, the monolithic film is no greater than about 3 mil (76 micrometers) thick, even no greater than about 1 mil (25 micrometers) thick, even no greater than about 0.75 mil (19 micrometers) thick, and even no greater than about 0.60 mil (15.2 micrometers) thick. In an extrusion coating process, the extruded layer and substrate layer are generally passed through a nip formed between two rolls (heated or unheated), generally before complete solidification of the film layer, in order to improve the bonding between the layers. A second nonwoven, woven or knitted layer can be introduced into the nip on the side of the film opposite the first substrate to form a moisture vapor permeable, substantially air impermeable laminate wherein the monolithic film is sandwiched between the two textile layers.

Polymeric materials suitable for forming moisture vapor permeable monolithic films include block polyether copolymers such as a block polyether ester copolymers, polyetheramide copolymers, polyurethane copolymers, poly(etherimide) ester copolymers, polyvinyl alcohols, or a combination thereof. Preferred copolyether ester block copolymers are segmented elastomers having soft polyether segments and hard polyester segments, as disclosed in Hagman, U.S. Pat. No. 4,739,012 that is hereby incorporated by reference. Suitable copolyether ester block copolymers include Hytrel® copolyether ester block copolymers sold by E. I. du Pont de Nemours and Company (Wilmington, Del.), and Arnitel® polyether-ester copolymers manufactured by DSM Engineering Plastics, (Heerlen, Netherlands). Suitable copolyether amide polymers are copolyamides available under the name Pebax® from Atochem Inc. of Glen Rock, N.J., USA. Pebax® is a registered trademark of Elf Atochem, S.A. of Paris, France. Suitable polyurethanes are thermoplastic urethanes available under the name Estane® from The B. F. Goodrich Company of Cleveland, Ohio, USA. Suitable copoly(etherimide) esters are described in Hoeschele et al., U.S. Pat. No. 4,868,062. The monolithic film layer can be comprised of multiple layers moisture vapor permeable film layers. Such a film may be co-extruded with layers comprised of one or more of the above-described breathable thermoplastic film materials.

According to aspects of the present invention, the metal and organic or in-organic coating layers are deposited on a non porous, moisture vapor permeable and substantially liquid impermeable substrate using methods that do not substantially reduce the moisture vapor permeability of the substrate. The metal and organic or in-organic coating layers are deposited via a vacuum vapor deposition method, this provides a coated composite substrate that has a moisture vapor permeability that is at least about 80%, even at least about 85%, and even at least about 90% of the moisture vapor permeability of the starting substrate material.

Vacuum vapor deposition methods known in the art are preferred for depositing the metal and organic or in-organic coatings. The thickness of the metal and organic or in-organic coatings are preferably controlled within ranges that provide a composite substrate having an emissivity no greater about 0.35.

The thickness and the composition of the outer organic or in-organic coating layer is selected such that, in addition to not substantially changing the moisture vapor permeability of the substrate layer, it does not significantly increase the emissivity of the metalized substrate. The outer organic or in-organic coating layer preferably has a thickness between about 0.2 μm and 2.5 μm, which corresponds to between about 0.15 g/m 2 to 1.9 g/m 2 of the coating material. In one embodiment, the outer coating layer has a thickness between about 0.2 μm and 1.0 μm (about 0.15 g/m 2 to 0.76 g/m 2), or between about 0.2 μm and 0.6 μm (about 0.15 g/m 2 to 0.46 g/m 2). The combined thickness of the intermediate and outer organic or in-organic layers is preferably no greater than about 2.5 μm, even no greater than about 2.0 μm, even no greater than about 1.5 μm. In one embodiment, the combined thickness of the intermediate and outer organic or in-organic coating layers is no greater than about 1.0 μm. For the structure Substrate/L1/M/L2, the intermediate coating layer preferably has a thickness between about 0.02 μm and 2 μm, corresponding to between about 0.015 g/m 2 and 1.5 g/m 2. In one embodiment, the intermediate coating layer has a thickness between about 0.02 μm and 1 μm (0.015 g/m 2 and 0.76 g/m 2), or between about 0.02 μm and 0.6 μm (0.015 g/m 2 and 0.46 g/m 2). When additional metal and organic or in-organic layers are deposited, the thickness of each organic or in-organic coating layer is adjusted such that the total combined thickness of all the organic or in-organic coating layers is no greater than about 2.5 μm, or no greater than about 1.0 μm. If the outer organic or in-organic coating layer is too thin, it may not protect the metal layer from oxidation, resulting in an increase in emissivity of the composite substrate. If the outer organic or in-organic coating layer is too thick, the emissivity of the composite substrate can increase, resulting in lower thermal barrier properties.

Suitable compositions for the organic coating layer(s) include polyacrylate polymers and oligomers. The coating material can be a cross-linked compound or composition. Precursor compounds suitable for preparing the organic coating layers include vacuum compatible monomers, oligomers or low MW polymers and combinations thereof. Vacuum compatible monomers, oligomers or low MW polymers should have high enough vapor pressure to evaporate rapidly in the evaporator without undergoing thermal degradation or polymerization, and at the same time should not have a vapor pressure so high as to overwhelm the vacuum system. The ease of evaporation depends on the molecular weight and the intermolecular forces between the monomers, oligomers or polymers. Typically, vacuum compatible monomers, oligomers and low MW polymers useful in this invention can have weight average molecular weights up to approximately 1200. Vacuum compatible monomers used in this invention are preferably radiation polymerizable, either alone or with the aid of a photoinitiator, and include acrylate monomers functionalized with hydroxyl, ether, carboxylic acid, sulfonic acid, ester, amine and other functionalities. The coating material may be a hydrophobic compound or composition. The coating material may be a crosslinkable, hydrophobic and oleophobic fluorinated acrylate polymer or oligomer, according to one preferred embodiment of the invention. Vacuum compatible oligomers or low molecular weight polymers include diacrylates, triacrylates and higher molecular weight acrylates functionalized as described above, aliphatic, alicyclic or aromatic oligomers or polymers and fluorinated acrylate oligomers or polymers. Fluorinated acrylates, which exhibit very low intermolecular interactions, useful in this invention can have weight average molecular weights up to approximately 6000. Preferred acrylates have at least one double bond, and preferably at least two double bonds within the molecule, to provide high-speed polymerization. Examples of acrylates that are useful in the coating of the present invention and average molecular weights of the acrylates are described in U.S. Pat. No. 6,083,628 and WO 98/18852.

Suitable compositions for the in-organic coating layers include metal oxide components including but not limited to Silicone dioxide, titanium dioxide, tungsten dioxide, zinc oxide. Inorganic coating layer(s) can be made by the sol-gel process of depositing a partially reacted metal alkoxide onto the substrate in the presence of water and an alcohol. The layer can also be produced from the deposition of a metal chloride solution. After application layers may be reduced in thickness by dry or moist heat treatment. The most effective method for deposition of metal alkoxide or metal chloride solutions onto the substrate is by flash evaporation and deposition in a vacuum environment.

Metals suitable for forming the metal layer(s) of the composites of the present invention include aluminum, gold, silver, zinc, tin, lead, copper, and their alloys. The metal alloys can include other metals, so long as the alloy composition provides a low emissivity composite substrate.

Each metal layer has a thickness between about 15 nm and 200 nm, or between about 30 nm and 60 nm. In one embodiment, the metal layer comprises aluminum having a thickness between about 15 and 150 nm, or between about 30 and 60 nm. Methods for forming the metal layer are known in the art and include resistive evaporation, electron beam metal vapor deposition, or sputtering. If the metal layer is too thin, the desired thermal barrier properties will not be achieved. If the metal layer is too thick, it can crack and flake off and also reduce the moisture vapor permeability of the composite. Generally it is preferred to use the lowest metal thickness that will provide the desired thermal barrier properties. When the composite of the present invention is used in a garment the metal layer reflects infrared radiation providing a radiant thermal barrier that reduces energy loss and keeps the person wearing the garment warmer.

The thermal barrier properties of a material can be characterized by its emissivity. Emissivity is the ratio of the power per unit area radiated by a surface to that radiated by a black body at the same temperature. A black body therefore has an emissivity of one and a perfect reflector has an emissivity of zero. The lower the emissivity, the higher the thermal barrier properties. Each metal layer, intermediate organic or in-organic coating and adjacent outer organic or in-organic coating layer is preferably deposited sequentially under vacuum without exposure to air or oxygen so that there is no substantial oxidation of the metal layer. Polished aluminum has an emissivity between 0.039-0.057, silver between 0.020 and 0.032, and gold between 0.018 and 0.035. A layer of uncoated aluminum generally forms a thin aluminum oxide layer on its surface upon exposure to air and moisture. The thickness of the oxide film increases for a period of several hours with continued exposure to air, after which the oxide layer reaches a thickness that prevents or significantly hinders contact of oxygen with the metal layer, reducing further oxidation. Oxidized aluminum has an emissivity between about 0.20-0.31. By minimizing the degree of oxidation of the aluminum by depositing the outer organic or in-organic coating layer prior to exposing the aluminum layer to the atmosphere, the emissivity of the composite substrate is significantly improved compared to an unprotected layer of aluminum. The outer organic coating layer also protects the metal from mechanical abrasion during roll handling, garment production and end-use.

Figure 19:
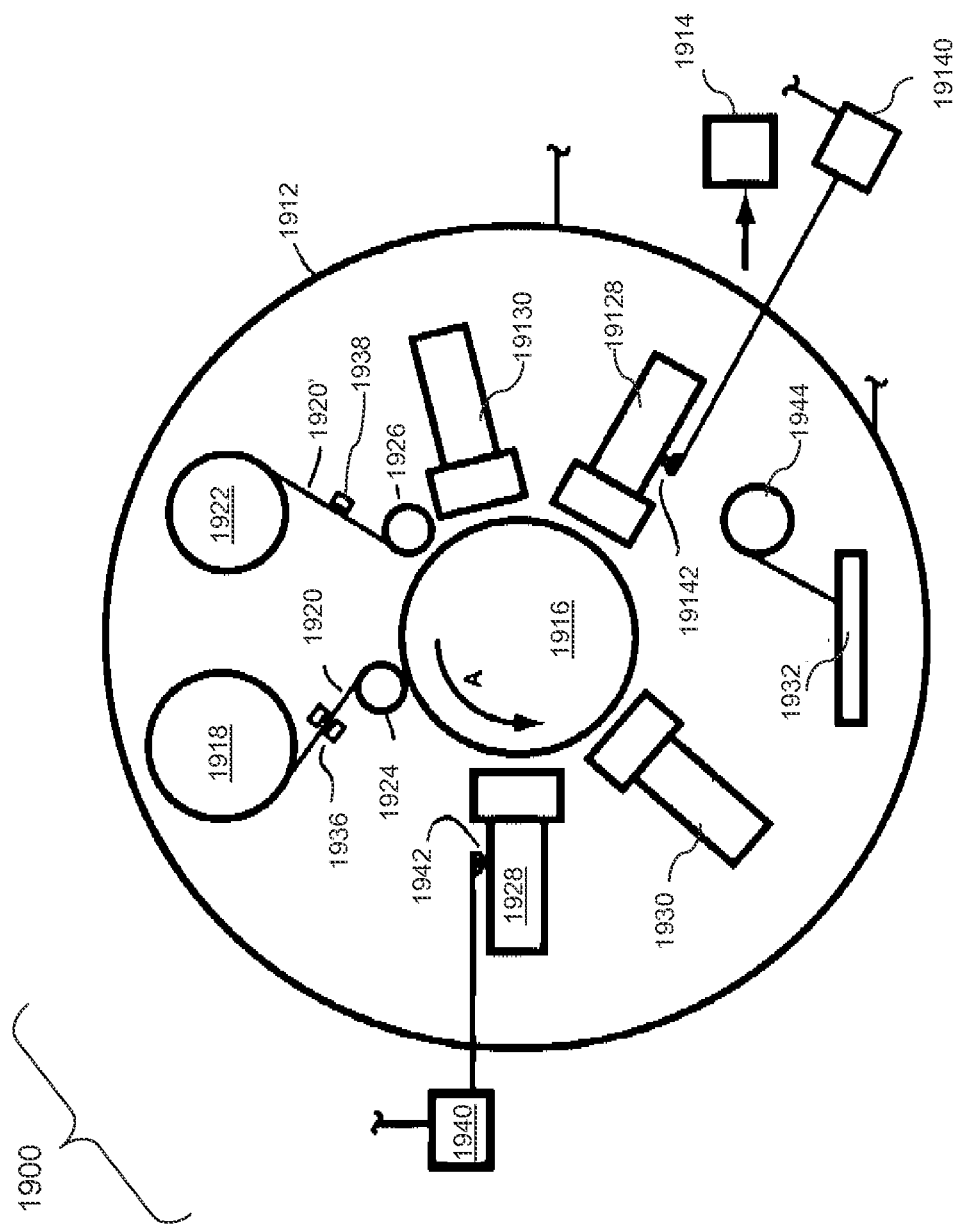
FIG. 19 is a diagram of an apparatus suitable for forming composites according to aspects of the invention.

FIG. 19 is a schematic diagram of an apparatus 1900 suitable for vapor-deposition coating of a substrate layer with organic, in-organic and metal layers under vacuum. In the description that follows, the term monomer is used to refer to vaporizable monomers, oligomers, and low molecular weight polymers. In the description that follows, the term sol-gel is used to refer to a solution of partially reacted metal alkoxide in the presence of water and an alcohol. The term inorganic layer includes layers of sol-gel composition.

A vacuum chamber 1912 is connected to a vacuum pump 1914, which evacuates the chamber to the desired pressure. Suitable pressures are between 2×10−4 to 2×10−5 Torr (2.66×10−5 to 2.66×10−6 kPa). Moisture vapor permeable substrate 1920 is fed from unwind roll 1918 onto a cooled rotating drum 1916, which rotates in the direction shown by arrow "A", via guide roll 1924. The surface speed of drum 1916 is generally in the range of 1 to 1000 cm/second. The substrate passes through several deposition stations after which it is picked off of the surface of the rotating drum by guide roller 1926 and taken up by wind-up roll 1922 as a coated composite substrate. Drum 1916 is cooled to a temperature specific to the particular monomer or sol-gel being used to form the organic or in-organic coating, and can be cooled down to −20° C. to facilitate condensation of the monomer or sol-gel. After unwinding from roll 1918, the substrate layer passes through optional plasma treatment unit 1936, where the surface of the substrate is exposed to a plasma to remove adsorbed oxygen, moisture, and any low molecular weight species on the surface of the substrate prior to forming the metal or monomer coating thereon. The surface energy of the substrate is generally modified to improve wetting of the surface by the coating layers. The plasma source may be low frequency RF, high frequency RF, DC, or AC. Suitable plasma treatment methods are described in U.S. Pat. No. 6,066,826, WO 99/58757 and WO 99/59185.

An intermediate organic or in-organic layer is formed on the substrate layer prior to depositing the metal layer. In one embodiment, organic monomer or sol-gel is deposited on the moisture vapor permeable substrate layer by monomer evaporator 1928, which is supplied with liquid monomer or sol-gel solution from a reservoir 1940 through an ultrasonic atomizer 1942, where, with the aid of heaters (not shown), the monomer or sol-gel liquid is instantly vaporized, i.e., flash vaporized, so as to minimize the opportunity for polymerization or thermal degradation prior to being deposited on the substrate layer. The monomer, oligomer, sol-gel solution or low molecular weight polymer liquid or slurry is preferably degassed prior to injecting it as a vapor into the vacuum chamber, as described in U.S. Pat. No. 5,547,508, which is hereby incorporated by reference. The specific aspects of the flash evaporation and monomer deposition process are described in detail in U.S. Pat. Nos. 4,842,893; 4,954,371; and 5,032,461, all of which are incorporated herein by reference.

The flash-vaporized monomer or sol-gel solution condenses on the surface of the substrate and forms a liquid monomer or sol-gel film layer. The monomer or sol-gel coating layer so that the composite substrate has a moisture vapor permeability of at least about 80% of the starting substrate layer. The condensed liquid monomer or sol-gel is solidified within a matter of milliseconds after condensation onto the substrate using a radiation curing means 1930. Suitable radiation curing means include electron beam and ultraviolet radiation sources which cure the monomer or sol-gel film layer by causing polymerization or cross-linking of the condensed layer. If an electron beam gun is used, the energy of the electrons should be sufficient to polymerize the coating in its entire thickness as described in U.S. Pat. No. 6,083,628, which is incorporated herein by reference. The polymerization or curing of monomer and oligomer layers is also described in U.S. Pat. Nos. 4,842,893, 4,954,371 and 5,032,461. Alternately, an oligomer or low molecular weight polymer can solidify simultaneously with cooling. For oligomers or low MW polymers that are solid at room temperature, curing may not be required as described in U.S. Pat. No. 6,270,841 that is incorporated herein by reference. Alternatively a sol-gel solution can be cured by the addition of heat to the coating film.

After depositing the intermediate organic or inorganic layer, the coated substrate layer then passes to metallization system 1932, where the metal layer is deposited on the solidified and optionally cured organic or inorganic layer. When a resistive metal evaporation system is used, the metallization system is continually provided with a source of metal from wire feed 1944.

Following the metallization step, the outer organic or inorganic coating layer is deposited in a similar process as described above for the intermediate polymer layer using evaporator 19128, monomer reservoir 19140, ultrasonic atomizer 19142, and radiation curing means 19130. The composition of the outer organic or inorganic coating layer can be the same or different than the intermediate organic or inorganic coating layer. Optionally, a metal, organic-coated or in-organic coated side of the substrate layer can be plasma treated prior to depositing an additional organic, inorganic or metal coating layer thereon.

The thickness of the coating is controlled by the line speed and vapor flux of the flash evaporator used in the vapor deposition process. As the coating thickness increases, the energy of the electron beam must be adjusted in order for the electrons to penetrate through the coating and achieve effective polymerization. For example, an electron beam at 10 kV and 120 mA can effectively polymerize acrylate coatings up to 2 µm thick.

If more than one metal layer and/or more than two organic or in-organic layers are desired, additional flash evaporation apparatuses and metallization stations can be added inside the vacuum chamber. Alternately, a substrate layer can be coated in a first pass in the apparatus shown in FIG. 19 followed by removing the coated substrate and running it in a second pass through the apparatus. Alternately, a separate apparatus can be used for the metallization and organic or inorganic coating steps.

Coatings can be applied on the reverse side of the composite through use of a second rotating drum 1916 that can be added within vacuum chamber 1912, with additional plasma treatment units 1936, monomer evaporators 1928, 19128, radiation curing means 1930, 19130 and metallization system 1932, which can be operated independently as desired. Such a dual-drum coating system is illustrated in FIG. 1 of WO 98/18852, which is incorporated herein by reference.

It is preferred that an organic or in-organic coating is deposited on a metal layer prior to removing the coated substrate from the vacuum chamber to prevent significant oxidation of the metal layer. It is most preferred to deposit the organic or in-organic coating layer(s) and metal layer(s) in a single pass to minimize the processing cost.

The metalized composite substrates of the present invention are especially suitable for use in apparel or outdoor equipment such as tents or sleeping bags. The highly reflective metalized surface of the composite substrate provides a low emissivity surface that enhances the performance of the apparel and reduces heat loss from the body by reflecting body heat back in the system. Additional benefits include shielding the body from excessive heat during the summer months.

Insulated Heat Reflecting Composites

Aspects of the present invention relate to an infra-red reflective, moisture vapor permeable composite formed by coating at least one side of a moisture vapor permeable substrate with at least one metal layer and coating this said metal layer with at least one insulating layer. This insulating layer is a textile with an open structure such that a high percentage of the metal layer is still exposed through the air gaps of the textile, thus maintaining good infrared reflectance. The said textile can be pre-treated to be hydrophilic, or chosen to have a filament structure or composition that is inherently hydrophilic so as to wick moisture off the metal surface between the air gaps of the textile. The metal layer itself can have an organic coating with hydrophobic functionalization to further protect it from moisture and oxidization. Preferably, a thin organic coating layer is also deposited on the outer surface of the substrate between the substrate layer and the metal coating layer to effectively encapsulate the metal layer and further protect it from moisture and oxidization. The coatings are preferably formed under vacuum using vapor deposition techniques under conditions that substantially coat the substrate without significantly reducing its moisture vapor permeability.

An example composite according to aspects of the present invention includes the following layers: Substrate/L1/M, Substrate/L1/M/L2, and Substrate/L1/M/L2/M/L3, etc. where Substrate is a moisture vapor permeable, substrate layer, M is a low emissivity metal layer and L1, L2, and L3 are organic coating layers comprising an organic polymer or organic oligomer, or blends thereof. The abbreviation "L1" is used herein to refer to an intermediate organic coating layer that is deposited on a surface of the substrate layer prior to depositing a metal layer thereon. The composite substrates optionally include at least one outer organic coating layer overlying the metal layer such as L2 and L3 in the above-described structures. In composite substrate structures having more than one metal layer, individual metal layers can be formed from the same or different metal and can have the same or different thickness. Similarly, in structures having more than one organic coating layer, the individual organic coating layers can have the same or different composition and/or thickness. Each metal layer can comprise more than one adjacent metal layers wherein the adjacent metal layers can be the same or different. Similarly, each organic layer can comprise more than one adjacent organic layer, wherein the adjacent organic layers can be the same or different. The substrate layer can be coated on one side, as in the structures described above, or on both sides such as in the following structures: L2/M/Substrate/M/L2, L2/M/L1/Substrate/L1/M/L2, etc.

According to aspects of the present invention, at least one textile fabric such as a woven, non-woven, or knitted fabric is applied to the substrate prior to coating with said organic and metal layers, where said textile fabric consists of nylon, polyester, wool, cotton, or other fiber and the said textile is combined with the substrate by process of lamination. Lamination can occur by using an adhesive, or a melt film, or a melt fiber between surfaces or a stitching/needling process.

According to aspects of the present invention, a textile fabric such as a woven, non-woven, or knitted fabric is applied to the substrate surface opposite the metal layer prior to coating with said organic and metal layers and an additional organic coating is deposited on the surface of said textile fabric opposite to the substrate layer to form the following composites: L2/Textile/Substrate/L1/M, L2/Textile/Substrate/L1/M/L2, etc. Where said textile fabric consists of nylon, polyester, wool or other fiber and said organic coating is selected from the group consisting of organic polymers, organic oligomers and combinations thereof and the coatings are preferably formed under vacuum using vapor deposition techniques.

According to aspects of the present invention, a textile fabric such as a woven, non-woven, or knitted fabric is applied to the substrate surface adjacent to the organic and metal layers prior to coating with said organic and metal layers to form the following composites: Substrate/Textile/L1/M, Substrate/Textile/L1/M/L2, etc. where the said textile consists of nylon, polyester, wool, cotton or other fiber and has filaments that are spaced apart. Spacing of the filaments ensures that a portion of the substrate surface is accessible so that said applied organic and metal coatings adhere to both the underlying substrate and the textile filaments. As an option to this preferred embodiment the choice of Textile is high wicking, in order to encourage moisture is attracted to it rather than the metallic layer, while also helping to promote better moisture management into the Substrate. The Textile may inherently be high wicking due to the choice of its fiber and mechanical filament structure, or pre-treated prior to bonding to the Substrate to be hydrophilic. Alternatively, the L1 coating may be functionalized to be hydrophilic and the L2 coating may be functionalized to be hydrophobic when forming the composite. Alternatively, with said same organic and metal layers to form the following composites, Substrate/L3/Textile/L1/M or Substrate/L3/Textile/L1/M/L2, etc, with functionalization of L3 to be hydrophilic and L1 and/or L2 Hydrophobic.

According to aspects of the invention, the said substrate is a non-porous, moisture vapor permeable and substantially liquid impermeable monolithic film.

According to aspects of the invention, the said substrate is a microporous, moisture vapor permeable membrane.

According to aspects of the invention, the said substrate is a sheet comprising: a moisture vapor permeable sheet layer having first and second outer surfaces, the sheet layer comprising at least one of a nonwoven fabric, woven fabric, nonwoven fabric-film laminate, woven fabric-film laminate, moisture vapor permeable film and composites thereof, wherein the first outer surface of the moisture vapor permeable sheet layer is a porous sheet selected from the group consisting of microperforated films, woven fabrics and nonwoven fabrics.

All said organic L1, L2, L3, layers above can also be replaced with an inorganic layer, such as a solgel, for example TiO2 with self cleaning functionality, or SiO2 providing protection from moisture while also having good infra red transparency.

In another embodiment of the present invention, at least one textile fabric such as a woven, non-woven, or knitted fabric is applied to the substrate after coating with said organic and metal layers, where the said textile is combined with the substrate by process of lamination. Lamination can occur by using an adhesive, or a melt film, or a melt fiber between surfaces or a stitching/needling process.

The thermal barrier properties of a material can be characterized by its emissivity. Emissivity is the ratio of the power per unit area radiated by a surface to that radiated by a black body at the same temperature. A black body therefore has an emissivity of one and a perfect reflector an emissivity of zero. The lower the emissivity, the higher the thermal barrier properties. Each metal layer, intermediate organic coating and adjacent outer organic coating layer is preferably deposited sequentially under vacuum without exposure to air or oxygen so that there is no substantial oxidation of the metal layer. Polished aluminum has an emissivity between 0.039-0.057, silver between 0.020 and 0.032, and gold between 0.018 and 0.035. A layer of uncoated aluminum generally forms a thin aluminum oxide layer on its surface upon exposure to air and moisture. The thickness of the oxide film increases for a period of several hours with continued exposure to air, after which the oxide layer reaches a thickness that prevents or significantly hinders contact of oxygen with the metal layer, reducing further oxidation. Oxidized aluminum has an emissivity between about 0.20-0.31. By minimizing the degree of oxidation of the aluminum by depositing the outer organic coating layer prior to exposing the aluminum layer to the atmosphere, the emissivity of the composite substrate is significantly improved compared to an unprotected layer of aluminum. The outer organic coating layer also protects the metal from mechanical abrasion during roll handling, garment production and end-use.

Insulated Heat Reflecting Composites with Patterned Insulation

Figure 20A:
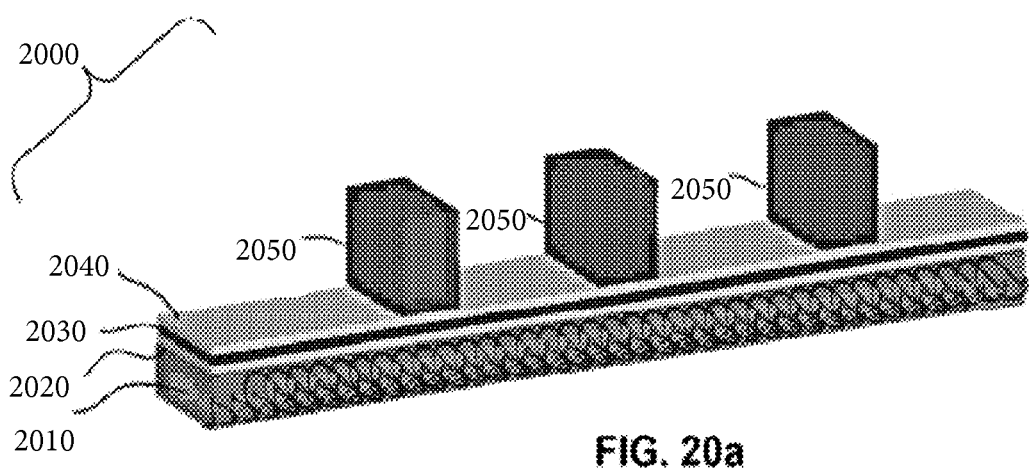
FIGS. 20a and 20b illustrate example composites according to aspects of the invention.
Figure 20B:
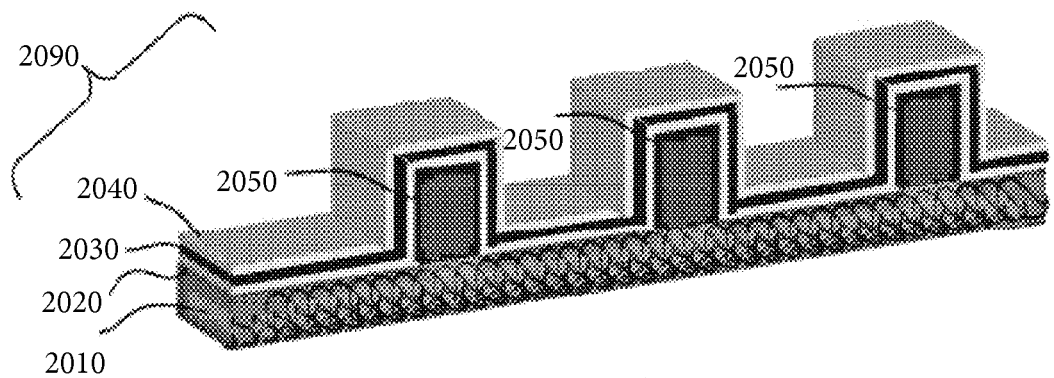

FIGS. 20a and 20b show example composites 2000, 2090 according to aspects of the invention which incorporate an infra-red reflective, moisture vapor permeable composite formed by coating at least one side of a moisture vapor permeable substrate 2010 with at least one metal layer 2030 and coating this said metal layer with at least one insulating layer 2050. This insulating layer 2050 has a pattern with an open structure such that a high percentage of the metal layer 2030 is still exposed through the air gaps of the textile, thus maintaining good infrared reflectance. The said insulating layer 2050 can be chosen to be hydrophilic, so as to wick moisture off the metal surface between the air gaps of the insulating layer 2050. The metal layer 2030 itself can have an organic or inorganic coating 2040 with hydrophobic functionalization to further protect it from moisture and oxidization. Preferably, a thin organic or inorganic coating layer 2020 is also deposited on the surface of the substrate 2010 between the substrate layer 2010 and the metal coating layer 2030 to effectively encapsulate the metal layer and further protect it from moisture and oxidization. The substrate 2010 can also optionally have an outer organic or inorganic coating 2070, to provide other functionalization useful in the application, such as oliophobic, hydrophobic, UV absorbing, antibacterial polymerisation and the like. The coatings are preferably formed under vacuum using vapor deposition techniques under conditions that substantially coat the substrate without significantly reducing its moisture vapor permeability.

According to aspects of the invention, as shown in FIG. 20a, the insulating layer 2050 can be applied to the substrate 2010 after to metallization 2030 and optional functional layers 2070, 2020 and 2030 are coated. In another embodiment, as shown in FIG. 20b, the insulating layer 2050 is already applied to the substrate 2010 prior to metallization 2030 and option functional layers 2070, 2020 and 2030 are coated.

An optional membrane (not shown) may be pre bonded to the substrate prior to other layers and coatings. This membrane can be a microporous type, such as PTFE, or a monolithic vapor permeable film, for example.

An example composite according to aspects of the present invention includes the following layers: Substrate/L1/M, Substrate/L1/M/L2, and Substrate/L1/M/L2/M/L3, etc. where Substrate is a moisture vapor permeable, substrate layer, M is a low emissivity metal layer and L1, L2, and L3 are organic coating layers comprising an organic polymer or organic oligomer, or blends thereof. The abbreviation "L1" is used herein to refer to an intermediate organic coating layer that is deposited on a surface of the substrate layer prior to depositing a metal layer thereon. The composite substrates optionally include at least one outer organic coating layer overlying the metal layer such as L2 and L3 in the above-described structures. In composite substrate structures having more than one metal layer, individual metal layers can be formed from the same or different metal and can have the same or different thickness. Similarly, in structures having more than one organic coating layer, the individual organic coating layers can have the same or different composition and/or thickness. Each metal layer can comprise more than one adjacent metal layers wherein the adjacent metal layers can be the same or different. Similarly, each organic layer can comprise more than one adjacent organic layer, wherein the adjacent organic layers can be the same or different. The substrate layer can be coated on one side, as in the structures described above, or on both sides such as in the following structures: L2/M/Substrate/M/L2, L2/M/L1/Substrate/L1/M/L2, etc.

According to aspects of the invention, at least one patterned insulating layer is applied to the substrate, either prior to or after coating with said organic and metal layers, where said insulating layer consists of a material that has relatively low thermal conductivity as compared to metal, and the said insulating layer is combined with the substrate by process of either printing, lamination, knitted, stitched, or vapor deposited through a mask. Lamination can occur by using an adhesive, or a melt film, or a melt fiber between surfaces or a stitching/needling process.

According to aspects of the invention, the insulation layer is applied to the substrate surface adjacent to the organic and metal layers prior to coating with said organic and metal layers to form the following composites: Substrate/Insulation/L1/M, Substrate/Insulation/L1/M/L2, etc. where said insulating layer is a material of low thermal heat conductivity and is combined with the substrate by process of either printing, lamination, knitted, stitched, or vapor deposited through a mask. The Insulation layer is formed in a pattern, such as shown in example by FIG. 21a, 21 b, 21c or 21d, or similar pattern, such that the spacing ensures that a portion of the substrate surface is accessible so that said applied organic and metal coatings adhere to both the underlying substrate and the insulating layer. As an option to this preferred embodiment the choice of Insulating layer is high wicking, in order to encourage moisture is attracted to it rather than the metallic layer, while also helping to promote better moisture management into the Substrate. Alternatively, the L1 coating may be functionalized to be hydrophilic and the L2 coating may be functionalized to be hydrophobic when forming the composite. Alternatively, with said same organic and metal layers to form the following composites, Substrate/L3/Insulatinon/L1/M or Substrate/L3/Insulation/L1/M/L2, etc, with functionalization of L3 to be hydrophilic and L1 and/or L2 Hydrophobic.

Figure 21A:
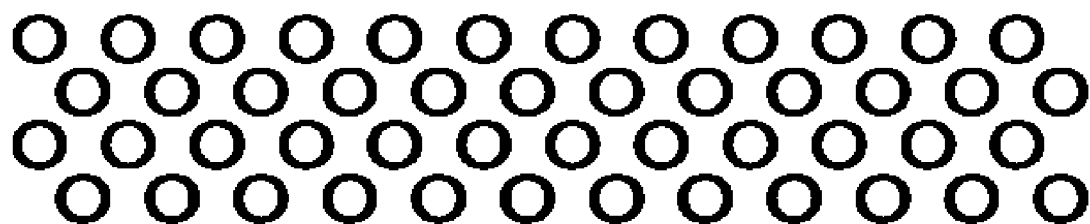
FIGS. 21a, 21b, 21c and 21d illustrate example geometries for patterned insulation according to aspects of the invention.
Figure 21B:
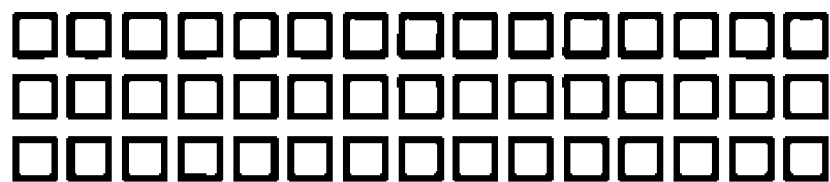
Figure 21C:
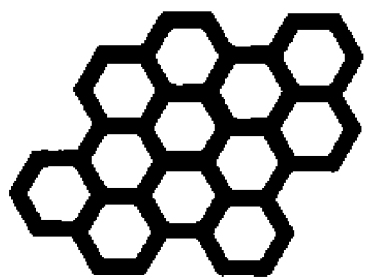
Figure 21D:
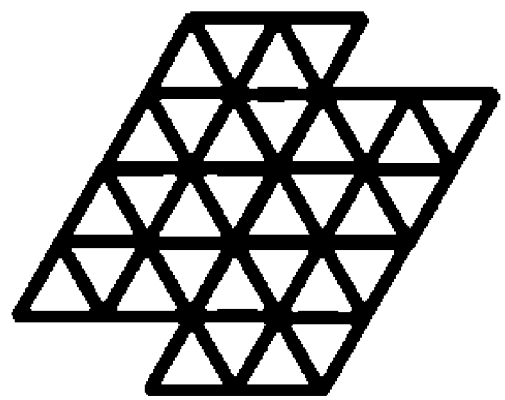

Patterns such as those examples in FIGS. 21a and 21b are chosen to help promote stretch of the composite, where as patterns such as those examples in FIGS. 21c and 21d are chosen to help improve mechanical separation for insulation.

According to aspects of the invention, the said substrate 2010 also has a non-porous, moisture vapor permeable and substantially liquid impermeable monolithic film (not shown) bonded to it. Alternatively this layer, in another preferred embodiment, is a microporous, moisture vapor permeable membrane.

According to aspects of the invention, the said substrate 2010 is a sheet comprising: a moisture vapor permeable sheet layer having first and second outer surfaces, the sheet layer comprising at least one of a nonwoven fabric, woven fabric, nonwoven fabric-film laminate, woven fabric-film laminate, moisture vapor permeable film and composites thereof, wherein the first outer surface of the moisture vapor permeable sheet layer is a porous sheet selected from the group consisting of microperforated films, woven fabrics and nonwoven fabrics.

All said organic L1, L2, L3, layers above may also be replaced with an inorganic layer, such as a solgel, for example TiO2 with self cleaning functionality, or SiO2 providing protection from moisture while also having good infra red transparency.

In another embodiment of the present invention, at least one textile fabric such as a woven, non-woven, or knitted fabric is applied to the substrate after coating with said organic and metal layers, where the said textile is combined with the substrate by process of lamination. Lamination can occur by using an adhesive, or a melt film, or a melt fiber between surfaces or a stitching/needling process.

FIG. 22 illustrates an example method 2200 according to the invention. Each step may be performed using materials and methods as further described with respect to FIGS. 19-21, and optionally, using any other materials and methods disclosed herein.

In a first step 2205, a moisture-vapor permeable substrate is provided.

In a second optional step 2210, the moisture-vapor permeable substrate is coated with a first functional coating.

In a third step 2215, an infrared-reflective material is deposited on the first functional coating, or on the substrate if there the first functional coating has not been used.

In a fourth optional step 2220, the infrared-reflective material is coated with a second functional coating.

In a fifth step 2225, a patterned insulation material is provided on the second functional coating, or on the infrared-reflective material if the second functional coating has not been used.

FIG. 23 illustrates an example method 2300 according to the invention. Each step may be performed using materials and methods as further described with respect to FIGS. 19-21, and optionally, using any other materials and methods disclosed herein.

In a first step 2305, a moisture-vapor permeable substrate is provided.

In a second optional step 2210, patterned insulation material is provided on the moisture-vapor permeable substrate In a third optional step 2215, the patterned insulation material and the surface of the moisture-vapor permeable substrate exposed through the insulation pattern is coated with a first functional coating.

In a fourth step 2220, an infrared-reflective material is deposited on the first functional coating, or on the surface of the moisture-vapor permeable substrate exposed through the insulation pattern if a first functional coating has not been used.

In a fifth optional step 2225, the infrared-reflective material is coated with a second functional coating.

Although the invention has been described with reference to a particular arrangement of parts, features and the like, these are not intended to exhaust all possible arrangements or features, and indeed many modifications and variations will be ascertainable to those of skill in the art.

What is claimed is:

1. A heat reflective composite, comprising:
   a substrate comprising a moisture vapor permeable, substantially liquid impermeable material;
   an insulating layer disposed over the substrate, the insulating layer comprising gaps that expose the substrate; and
   a reflective layer comprising an infrared-reflective metallic material, the reflective layer being disposed on the insulating layer, within substantially all gaps of the insulating layer that expose the substrate, and on substantially all surfaces of the substrate that are exposed through gaps of the insulating layer.

2. The heat reflective composite of claim 1, wherein the substrate comprises one or more of polyether ester, polyether amide, or polyether urethane film; nonwoven fabric, woven fabric, nonwoven fabric-film laminate, woven fabric-film laminate, microperforated film; or, a microporous, air-permeable, moisture vapor transmissive, water resistant and drapeable polymeric membrane.

3. The heat reflective composite of claim 1, wherein the reflective layer comprises one or more of aluminum, gold, silver, zinc, tin, lead, copper, AgGe, CuZn, CuSn, CuAg, CuAgSn, or any alloy, oxide, or combination of these materials having an emissivity less than 0.5.

4. The heat reflective composite of claim 1, wherein the insulating layer comprises a hydrophilic or porous textile.

5. The heat reflective composite of claim 1, wherein the insulating layer is laminated to the substrate; printed on the substrate; knitted into the substrate; or is vapor deposited onto the substrate.

6. The heat reflective composite of claim 1, wherein the reflective layer is not disposed on surfaces of the substrate that are (i) covered by the insulation layer and (ii) exposed through gaps of the insulating layer.

7. The heat reflective composite of claim 1, wherein the reflective layer is disposed within all of the gaps of the insulating layer that expose the substrate, and on all surfaces of the substrate that are exposed through gaps of the insulating layer.

8. The heat reflective composite of claim 1, wherein all gaps of the insulating layer that expose the substrate collectively define a predetermined pattern.

9. The heat reflective composite of claim 8, wherein the predetermined pattern comprises an array or lattice of circles or polygons.

\* \* \* \* \*